(12) United States Patent
Maruyama et al.

(10) Patent No.: US 9,052,600 B2
(45) Date of Patent: Jun. 9, 2015

(54) METHOD FOR FORMING RESIST PATTERN AND COMPOSITION FOR FORMING PROTECTIVE FILM

(75) Inventors: Ken Maruyama, Tokyo (JP); Koji Inukai, Tokyo (JP)

(73) Assignee: JSR CORPORATION, Tokyo (JP)

( * ) Notice: Subject to any disclaimer, the term of this patent is extended or adjusted under 35 U.S.C. 154(b) by 42 days.

(21) Appl. No.: 13/604,810

(22) Filed: Sep. 6, 2012

(65) Prior Publication Data

US 2013/0059252 A1  Mar. 7, 2013

(30) Foreign Application Priority Data

Sep. 6, 2011 (JP) ................................. 2011-194396
Mar. 27, 2012 (JP) ................................. 2012-072553
Aug. 8, 2012 (JP) ................................. 2012-176526

(51) Int. Cl.
  *G03F 7/11* (2006.01)
  *G03F 7/20* (2006.01)
  *G03F 7/09* (2006.01)
  *G03F 7/039* (2006.01)

(52) U.S. Cl.
  CPC ............ *G03F 7/2059* (2013.01); *G03F 7/2037* (2013.01); *G03F 7/0397* (2013.01); *G03F 7/091* (2013.01); *G03F 7/11* (2013.01)

(58) Field of Classification Search
  CPC ........... G03F 7/09; G03F 7/11; G03F 7/2047; G03F 7/2051; G03F 7/26; G03F 7/2037
  USPC ........ 430/270.1, 271.1, 273.1, 311, 322, 942, 430/296
  See application file for complete search history.

(56) References Cited

U.S. PATENT DOCUMENTS

| | | | |
|---|---|---|---|
| 3,841,903 A * | 10/1974 | Huang et al. .................. 427/377 |
| 5,856,071 A * | 1/1999 | Kotachi et al. ................ 430/326 |
| 7,776,506 B2 * | 8/2010 | Wang et al. ................ 430/270.1 |
| 2005/0277055 A1 * | 12/2005 | Kon .......................... 430/270.1 |
| 2009/0111057 A1 * | 4/2009 | Xu et al. ....................... 430/311 |
| 2009/0286182 A1 * | 11/2009 | Harada et al. .............. 430/285.1 |
| 2010/0136488 A1 * | 6/2010 | Fukuhara ..................... 430/319 |
| 2013/0209940 A1 * | 8/2013 | Sakamoto et al. ............ 430/319 |

FOREIGN PATENT DOCUMENTS

| | | |
|---|---|---|
| EP | 1 480 078 * | 11/2004 |
| JP | 06-12452 B2 | 5/1984 |
| JP | 59-93448 | 5/1984 |
| JP | 05-188598 | 7/1993 |
| JP | 2006-171440 | 6/2006 |
| JP | 2008-065304 * | 3/2008 |
| JP | 2010-204634 | 9/2010 |
| JP | 2011-16746 | 1/2011 |
| WO | WO 2012/053302 * | 4/2012 |

OTHER PUBLICATIONS

Machine translation of JP 2008-065304, published on Mar. 21, 2008.*

Kobayashi, E., Murata, M., Yamachika, M., Kobayashi, Y., Yumoto, Y., Miura, T.—An Alkaline-Developable Resist Based on Silylated Polyhydroxystyrene for KrF Excimer Lithography, Polymers for Microelectronics, ACS Symposium Series, American Chemical Society, 1993, pp. 88-100.*

* cited by examiner

*Primary Examiner* — Anca Eoff
(74) *Attorney, Agent, or Firm* — Oblon, McClelland, Maier & Neustadt, L.L.P.

(57) ABSTRACT

A method for forming a resist pattern includes providing a resist film. A protective film is provided on the resist film using a composition for forming the protective film. The composition includes a polymer and an organic solvent. The resist film on which the protective film is provided is exposed to irradiation with EUV light or an electron beam. The exposed resist film is developed.

10 Claims, 2 Drawing Sheets

METHOD FOR FORMING RESIST PATTERN AND COMPOSITION FOR FORMING PROTECTIVE FILM

CROSS-REFERENCE TO RELATED APPLICATIONS

The present application claims priority under 35 U.S.C. §119 to Japanese Patent Application No. 2011-194396, filed Sep. 6, 2011, to Japanese Patent Application No. 2012-72553, filed Mar. 27, 2012, and to Japanese Patent Application No. 2012-176526, filed Aug. 8, 2012. The contents of these applications are incorporated herein by reference in their entirety.

BACKGROUND OF THE INVENTION

1. Field of the Invention

The present invention relates to a method for forming a resist pattern, and a composition for forming a protective film.

2. Discussion of the Background

Conventionally, in manufacturing processes of semiconductor devices such as IC and LSI, microfabrication by lithography using photoresist compositions has been carried out. In recent years, with enhanced integration in integrated circuits, ultrafine pattern formation on a sub-micron scale and a quarter-micron scale has been demanded. With such demands, shorter exposure wavelengths, e.g., from g-line to i-line, a KrF excimer laser beam, and further an ArF excimer laser beam tend to be employed. In addition, more recently, lithography techniques using EUV light, electron beams, and the like in addition to the excimer laser beams have been developed (see Japanese Unexamined Patent Application, Publication No. 2006-171440, Japanese Unexamined Patent Application, Publication No. 2011-16746 and Japanese Unexamined Patent Application, Publication No. 2010-204634).

The lithography techniques using EUV light or electron beams have been anticipated as next-generation pattern formation techniques that enable a pattern formation on an ultrafine scale of no greater than 32 nm.

SUMMARY OF THE INVENTION

According to one aspect of the present invention, a method for forming a resist pattern includes providing a resist film. A protective film is provided on the resist film using a composition for forming the protective film. The composition includes a polymer and an organic solvent. The resist film on which the protective film is provided is exposed to irradiation with EUV light or an electron beam. The exposed resist film is developed.

According to another aspect of the present invention, a composition for forming a protective film includes a polymer and an organic solvent. The composition is used for coating a surface of a resist film in a method for forming a resist pattern using EUV light or an electron beam.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
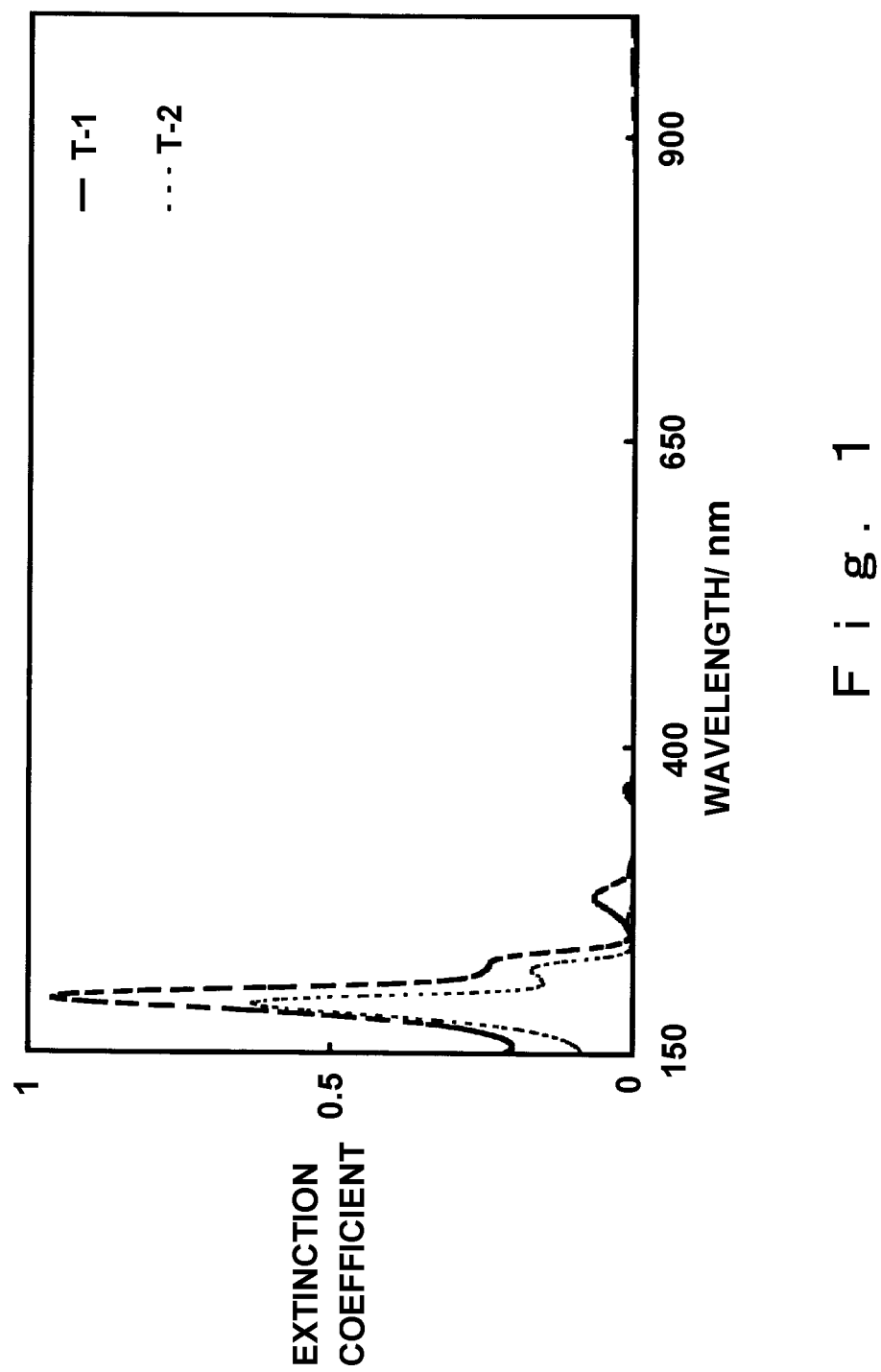
FIG. 1 shows a view illustrating results of measurement of the extinction coefficient of each composition for forming a protective film.

One aspect of the embodiment of the present invention made for solving the foregoing problems is a method for forming a resist pattern, the method including the steps of:

(1) forming a resist film;

(2) forming a protective film on the resist film using a composition for forming a protective film;

(3) exposing by irradiation with EUV light or an electron beam the resist film on which the protective film has been laminated; and (4) developing the exposed resist film, wherein the composition for forming a protective film contains:

(A) a polymer; and (B) an organic solvent.

In an exposure using EUV light, light having a wavelength of about 150 nm. to 350 nm is emitted together with EUV light having a wavelength of 13.5 nm, i.e., out-of-band (hereinafter, referred to as "OOB") radiation. In the method for forming a resist pattern of the embodiment of the present invention, on a resist film a protective film formed from the composition for forming a protective film containing the polymer (A) and the organic solvent (B) is laminated, whereby a surface of the resist film is coated. When the surface of the resist film is coated with such a protective film, the OOB radiation generated upon exposure is absorbed by the protective film, so that inhibition of a decrease of a resolving ability of a resist reportedly result from the OOB radiation, and amelioration of nanoedge roughness are enabled. As a result, in the method for forming a resist pattern, use of the protective film formed from the composition for forming a protective film enables sensitivity and a resolving ability of a resist to be enhanced and nanoedge roughness to be ameliorated. In addition, the protective film can also inhibit outgassing (hereinafter, may be also referred to as "OG") generated from the resist film.

The polymer (A) preferably has a structural unit including at least one selected from the group consisting of an aromatic group and a heteroaromatic group. Due to having the structural unit including an aromatic group and/or a heteroaromatic group, the polymer (A) can absorb light having a wavelength of no less than 150 nm and no greater than 350 nm. Thus, the method for forming a resist pattern enables influences from OOB radiation accompanied with EUV light upon exposure to be reduced. As a result, according to the method for forming a resist pattern, sensitivity and a resolving ability in a resist can be enhanced and nanoedge roughness can be further ameliorated.

The polymer (A) preferably has a structural unit including at least one selected from the group consisting of an aromatic group and a heteroaromatic group with the content of no less than 50% by mole. When the polymer (A) has the structural unit including at least one selected from the group consisting of an aromatic group and a heteroaromatic group with the content of no less than 50% by mole, the method for forming a resist pattern enables influences from the OOB radiation generated by an EUV light source upon exposure to be effectively reduced.

The polymer (A) preferably has a structural unit (I) including at least one type of group selected from the set consisting of groups represented by the following formulae (i-1) to (i-8):

(i-1) 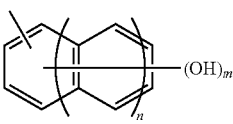

(i-2) 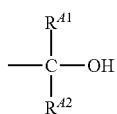

(i-3) 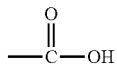

(i-4) 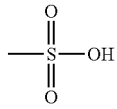

(i-5) 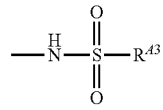

(i-6) 

(i-7) 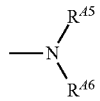

(i-8) 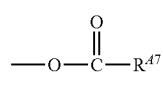

wherein, in the formula (i-1), n is an integer of 0 to 3, and m is an integer that satisfies the expression: $1 \leq m \leq 5+2n$;

in the formulae (i-2) and (i-5), $R^{41}$, $R^{42}$ and $R^{43}$ each independently represent a fluorine atom or an alkyl group, wherein a part or all of hydrogen atoms that the alkyl group has are unsubstituted or optionally substituted by a fluorine atom;

in the formula (i-6), $R^{44}$ represents an aromatic group substituted by a fluorine atom or a fluorinated alkyl group or a heteroaromatic group substituted by a fluorine atom or a fluorinated alkyl group;

in the formula (i-7), $R^{45}$ and $R^{46}$ each independently represent a hydrogen atom or an alkyl group, wherein a part or all of hydrogen atoms that the alkyl group has are unsubstituted or optionally substituted by a fluorine atom; and in the formula (i-8), $R^{47}$ represents an alkyl group.

When the polymer (A) has the structural unit (I) including the above specific group, the method for forming a resist pattern enables more light having a wavelength of no less than 150 nm and no greater than 350 nm to be absorbed, thereby resulting in more decreased influences from the OOB radiation accompanied with EUV light upon exposure. As a result, according to the method for forming a resist pattern, further enhancement of sensitivity and a resolving ability of a resist and further amelioration of nanoedge roughness are enabled.

The structural unit (I) preferably includes a group represented by the above formula (i-1). When the polymer (A) has the structural unit (I) including the above specific group, the method for forming a resist pattern enables light having a wavelength of no less than 150 nm and no greater than 350 nm to be further efficiently absorbed, thereby resulting in a further reduction of influences from the OOB radiation that an EUV light source generates upon exposure. As a result, according to the method for forming a resist pattern, still further enhancement of sensitivity and a resolving ability of a resist and still further amelioration of nanoedge roughness can be achieved.

The structural unit (I) is preferably represented by the following formula (1):

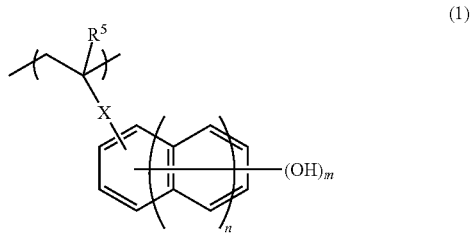

(1)

wherein, in the formula (1), $R^5$ represents a hydrogen atom, a methyl group or a trifluoromethyl group; X represents a single bond, —(CO)O— or —(CO)NH—; and m and n are as defined in connection with the above formula (i-1).

When the structural unit (I) has the above structure, the method for forming a resist pattern enables sensitivity and a resolving ability of a resist to be further enhanced, and nanoedge roughness to be further ameliorated.

The organic solvent (B) preferably includes at least one type of solvent selected from the group consisting of an ether type solvent and an alcohol type solvent. Since the resist film is less likely to be dissolved in these specific solvents, when a solvent including such a specific solvent is used as the organic solvent (B), the method for forming a resist pattern enables elution of resist film components that occurs in application of the composition for forming a protective film on the resist film to be inhibited.

It is preferred that the organic solvent (B) includes an ether type solvent, and the content of the ether type solvent is preferably no less than 20% by mass. When the organic solvent (B) is such a solvent, the method for forming a resist pattern enables elution of resist film components that occurs in application of the composition for forming a protective film on the resist film to be inhibited.

The greatest value of the extinction coefficient of the protective film formed in the step (2) in the range of a wavelength of no less than 150 nm and no greater than 350 nm is preferably no less than 0.3. When the protective film can absorb light having a wavelength of no less than 150 nm and no more than 350 nm, the protective film formed from the composition for forming a protective film in the method for forming a resist pattern can reduce influences from the OOB radiation that an EUV light source generates. As a result, the method for forming a resist pattern enables further enhancement of sensitivity and a resolving ability of a resist and further amelioration of nanoedge roughness.

According to another aspect, the composition for forming a protective film of the embodiment of the present invention is used for coating the surface of a resist film in the method for forming a resist pattern using EUV light or an electron beam, and contains:

(A) a polymer; and (B) an organic solvent.

In a method for forming a resist pattern using EUV light or an electron beam, the above composition for forming a protective film is used so as to coat the surface of a resist film to form a protective film on the resist film. Such a protective film absorbs OOB radiation that is generated upon exposure, whereby inhibition of a decrease of a resolving ability of a resist reportedly results from the OOB radiation and amelioration in nanoedge roughness of the resultant pattern are enabled. In addition, the protective film can also inhibit OG that a resist film generates. As a result, the composition for forming a protective film can enhance sensitivity and a resolving ability of a resist and ameliorate nanoedge roughness.

According to the method for forming a resist pattern of the embodiment of the present invention, in lithography techniques using EUV light or an electron beam, influences from OOB radiation that is generated upon exposure is reduced, whereby a sufficiently satisfactory resolving ability and sensitivity of a resist can be attained, and nanoedge roughness can be ameliorated. In addition, according to the method for forming a resist pattern, generation of OG from a resist film can be also inhibited. Therefore, the method for forming a resist pattern, and the composition for forming a protective film suitably used in the method for forming a resist pattern can be suitably used for fine resist pattern formation in lithography steps of various types of electronic devices such as semiconductor devices and liquid crystal devices.

The embodiments will now be described with reference to the accompanying drawings, wherein like reference numerals designate corresponding or identical elements throughout the various drawings.

<Method for Forming a Resist Pattern>

The method for forming a resist pattern according to the embodiment of the present invention includes the steps of:

(1) forming a resist film (hereinafter, may be also referred to as "(1) step");

(2) forming a protective film on the resist film using a composition for forming a protective film (hereinafter, may be also referred to as "(2) step");

(3) exposing the resist film on which the protective film was laminated by irradiation with EUV light or an electron beam (hereinafter, may be also referred to as "(3) step"); and (4) developing the exposed resist film (hereinafter, may be also referred to as "(4) step"), wherein the composition for forming a protective film contains (A) a polymer, and (B) an organic solvent.

Hereinafter, each step, composition for forming a protective film, and photoresist composition will be described in detail.

[(1) Step]

In this step, a resist film is formed. The resist film is formed by coating on a substrate by using usually a photoresist composition. As a substrate, for example, conventionally well-known substrates such as a silicon wafer and a wafer coated with aluminum can be used. In addition, organic type or inorganic type underlayer antireflective films disclosed in, for example, Japanese Examined Patent Application, Publication No. H06-12452, Japanese Unexamined Patent Application, Publication No. S59-93448, and the like may be formed on a substrate. It is to be noted that the photoresist composition will be described in detail later.

A coating method is exemplified by spin coating, cast coating, roll coating and the like. It is to be noted that the film thickness of the resist film formed is typically 0.01 µm to 1 µm, and preferably 0.01 µm to 0.5 µm.

After the photoresist composition is coated, a solvent in a coating film may be volatilized by prebaking (PB) as needed. Heating conditions in the PB are appropriately selected depending on the blend composition of the photoresist composition and typically include about 30° C. to 200° C. and preferably 50° C. to 150° C.

In addition, in order to prevent influences from basic impurities and the like contained in an environmental atmosphere, for example, a protective film disclosed in Japanese Unexamined Patent Application, Publication No. H5-188598, etc. may be provided on a resist layer.

[(2) Step]

In this step, a protective film is formed on the resist film using a composition for forming a protective film. The protective film is formed typically by coating the composition for forming a protective film. In this procedure, the composition for forming a protective film is coated such that the composition for forming a protective film covers the surface of the resist film. The protective film is laminated on the surface of the resist film, whereby influences from the OOB radiation that is generated upon exposure can be reduced, resolving ability of a resist can be enhanced, and nanoedge roughness of the resultant pattern can be ameliorated.

The coating method is not particularly limited as long as the composition for forming a protective film is coated so as to cover the surface of the resist film, and is exemplified by spin coating, cast coating, roll coating, and the like. It is to be noted that the film thickness of the protective film to be formed is typically 0.01 µm to 1 µm, and preferably 0.01 µm to 0.5 µm.

After the composition for forming a protective film is coated, a solvent in a coating film may be volatilized by the PB as needed. Heating conditions in the PB are appropriately selected depending on the blend composition of the composition for forming a protective film and typically include about 30° C. to 200° C. and preferably 50° C. to 150° C.

It is to be noted that the protective film formed from the composition for forming a protective film preferably absorbs light having a wavelength of no less than 150 nm and no greater than 350 nm. The protective film exhibits the greatest value of an extinction coefficient of preferably no less than 0.3, and more preferably no less than 0.5 when an optical coefficient (i.e., the extinction coefficient) in the range of a wavelength of no less than 150 nm and no greater than 350 nm of the protective film is measured using, for example, a spectroscopic ellipsometer, etc. The greatest value of the extinction coefficient may or may be not a maximum value of the peak. For example, the maximum of the peak may be present out of the above-described range of the wavelength, and the value of the extinction coefficient in a skirt of the peak may satisfy the requirements in the range of the wavelength. When the protective film can absorb light having a wavelength of no less than 150 nm and no greater than 350 nm, the protective film formed from the composition for forming a protective film in the method for forming a resist pattern can reduce influences from the OOB radiation that an EUV light source generates.

[(3) Step]

In this step, the resist film on which the protective film has been laminated is exposed by irradiation with EUV light or an electron beam. Exposure conditions such as exposure dose can be appropriately selected depending on the blend composition of the photoresist composition, types of additives or the like to be used. For example, an isolated space pattern can be formed by subjecting a desired area of the resist film to reduced projection exposure through an isolated line pattern mask. In a similar manner, a hole pattern can be formed by carrying out reduction projection exposure through a mask having a dot pattern. Alternatively, the exposure may be carried out with a mask pattern having a desired pattern twice or more. In the case in which the exposure is carried out twice or more, the exposure is preferably carried out continuously. In the case in which the exposure is carried out in a plurality of times, for example, a first reduction projection exposure is carried out through a line-and-space pattern mask in a desired area, followed by a second reduction projection exposure such that lines cross over light-exposed sites subjected to the first exposure. It is preferred that the first light-exposed sites orthogonally cross over the second light-exposed site. Due to orthogonal crossing of the first light-exposed site and the second light-exposed site, a contact hole pattern can be formed at the light-unexposed site surrounded by the light-exposed site. In the case in which an electron beam is irradiated, the exposure is carried out by, for example, scanning the electron beam to be irradiated.

The method for forming a resist pattern may have a plurality of times of the exposure steps as described above. In the plurality of times of the exposure, the same radioactive ray (EUV light or electron beam) may be used or different radioactive rays may be used.

In addition, post-exposure baking (PEB) is preferably carried out after the exposure. Due to carrying out the PEB, a dissociation reaction of an acid-dissociable group in the photoresist composition can smoothly proceed. Heating condition in PEB includes typically 30° C. to 200° C., and preferably 50° C. to 170° C.

[(4) Step]

In this step, the exposed resist film is developed. A developing solution used for development is preferably an alkaline aqueous solution. Examples of alkali include inorganic alkalis such as sodium hydroxide, potassium hydroxide, sodium carbonate, sodium silicate, sodium metasilicate and ammonia; quaternary ammonium salts such as tetramethylammonium hydroxide and tetraethyl ammonium hydroxide, and the like. In addition, in such an alkaline aqueous solution, a water soluble organic solvent such as methanol or ethanol, or a surfactant may be also used by adding in an appropriate amount. The concentration of the alkali in the alkaline aqueous solution is preferably no less than 0.1% by mass and no more than 5% by mass in light of obtaining appropriate developability. As a developing method, an appropriate method such as, for example, a puddling method, a dipping method, a shaking immersion method or a showering method may be employed. The development time period may vary depending on the composition of the photoresist composition to be used, and is preferably about 10 sec to 180 sec. Subsequent to the development treatment, for example, washing with running water is carried out for 30 sec to 90 sec, followed by, for example, air-drying with compressed air or compressed nitrogen, thereby enabling a desired pattern to be formed.

To the developing solution, a surfactant may be added in an appropriate amount as needed. As the surfactant, for example, an ionic or nonionic fluorine type and/or silicon type surfactant, etc. may be used.

Examples of the development method include a dipping method in which the substrate is immersed in a container filled with the developer for a given time period, a puddling method that allows the developer to be present still on the surface of the substrate by way of surface tension for a given time period to allow for the development, a spraying method that in which the developer is sprayed onto the surface of the substrate, a dynamic dispensing method in which the developer is continuously applied onto the substrate that is rotated at a constant speed while scanning with a developer application nozzle at a constant speed, and the like.

The method for forming a resist pattern preferably includes a rinsing step in which the resist film is washed with a rinse liquid after the step (4). As the rinse liquid in the rinsing step, water may be used. Due to using water as a rinse liquid, scum generated can be efficiently washed off.

<Composition for Forming a Protective Film>

In the method for forming a resist pattern, the composition for forming a protective film of the embodiment of the present invention can be suitably used. The composition for forming a protective film is used for coating a surface of the resist film in the method for forming a resist pattern using EUV light or an electron beam, and contains the polymer (A) and the organic solvent (B). It is to be noted that the composition for forming a protective film may contain other optional components other than the polymer (A) and the organic solvent (B) as long as the effects of the invention are not impaired. Hereinafter, each component will be described in detail.

<(A) Polymer>

The polymer (A) is not particularly limited as long as the polymer (A) is a polymer capable of forming a protective film, and is acceptable when the polymer (A) can be dissolved into a developer solution used in the development step of the method for forming a resist pattern, but the polymer (A) preferably absorbs light having a wavelength of no less than 150 nm and no greater than 350 nm. When the polymer (A) can absorb light having a wavelength of no less than 150 nm and no greater than 350 nm, a protective film formed from the composition for forming a protective film can reduce influences from the OOB radiation. As a result, the composition for forming a protective film can enhance sensitivity and a resolving ability of a resist and also can ameliorate nanoedge roughness in the method for forming a resist pattern of the embodiment of the present invention.

The polymer (A) capable of absorbing light in the range of a wavelength of no less than 150 nm and no greater than 350 nm preferably has a structural unit including at least one selected from the group consisting of an aromatic group and a heteroaromatic group. When the polymer (A) has a structural unit including at least one selected from the group consisting of an aromatic group and a heteroaromatic group, the polymer (A) can absorb light having a wavelength of no less than 150 nm and no greater than 350 nm; therefore, the method for forming a resist pattern can reduce influences from the OOB radiation that an EUV light source generates upon exposure.

The aromatic group is exemplified by a group including a benzene ring, a group including a naphthalene ring, a group including an anthracene ring, and the like.

The heteroaromatic group is exemplified by a group including a pyrrole ring, a group including a furan ring, a group including a thiophene ring, a group including a pyridine ring, a group including a pyrimidine ring, and the like.

The polymer (A) has a structural unit including at least one selected from the group consisting of an aromatic group and a heteroaromatic group, in an amount of preferably no less than 50% by mole, more preferably no less than 60% by mole, further preferably no less than 70% by mole, and particularly preferably no less than 80% by mole with respect to the total of the structural unit constituting the polymer (A). When the polymer (A) has the structural unit in an amount of no less than 50% by mole, the method for forming a resist pattern enables influences from the OOB radiation that an EUV light source generates upon exposure to be effectively reduced.

In addition, the polymer (A) preferably has the structural unit (I) including at least one type of group selected from the set consisting of groups represented by the above formulae (i-1) to (i-8). It is to be noted that as long as the effects of the invention are not impaired, the polymer (A) may have any structural unit other than the structural unit (I). Hereinafter, each structural unit will be described in detail.

<Structure Unit (I)>

The structural unit (I) is a structural unit including at least one type of group selected from the set consisting of groups represented by the above formulae (i-1) to (i-8). The structural unit (I) is preferably a structural unit including a group represented by the above formula (i-1), (i-2) or (i-5) among these groups, more preferably a structural unit including a group represented by the above formula (i-1) or (i-2), and further preferably a structural unit including a group represented by the above formula (i-1). Hereinafter, the structural unit (I) including a group represented by any of the above formulae (i-1) to (i-8) will be described in detail.

[Structure Unit (I) Including a Group Represented by the Above Formula (i-1)]

The structural unit (I) including the group represented by the above formula (i-1), enables light having a wavelength of no less than 150 nm and no greater than 350 nm to be further absorbed, so that a protective film formed from the composition for forming a protective film can effectively reduce influences from the OOB radiation. In addition, the protective film also has effects against OG.

In the above formula (i-1), n is an integer of 0 to 3; and m is an integer satisfying the expression: 1≤m≤5+2n.

The n is preferably 0 or 1, and more preferably 0. The m is preferably an integer of 1 to 4, more preferably 1 or 2, and further preferably 1.

The structural unit (I) including a group represented by the above formula (i-1) is preferably represented by the above formula (1).

In the above formula (1), $R^5$ represents a hydrogen atom, a methyl group or a trifluoromethyl group; X represents a single bond, —(CO)O— or —(CO)NH—; and m and n are as defined in connection with the above formula (i-1).

The structural unit represented by the above formula (1) is, in light of having superior effects against the OOB radiation, preferably a structural unit represented by the following formula (1-6).

[Structure Unit (I) Including a Group Represented by the Above Formula (i-2)]

When the structural unit (I) includes a group represented by the above formula (i-2), the protective film formed from the composition for forming a protective film has superior effects against the OOB radiation and OG.

In the above formula (i-2), $R^{41}$ and $R^{42}$ each independently represent a fluorine atom or an alkyl group, wherein, a part or all of hydrogen atoms that the alkyl group has may be substituted by a fluorine atom.

Examples of the alkyl group represented by the $R^{41}$ and $R^{42}$ include a methyl group, an ethyl group, a propyl group, a butyl group, a hexyl group, an octyl group, a decyl group, and the like.

Examples of the group in which a part or all of the hydrogen atoms that the alkyl group are substituted by a fluorine atom and which is represented by the $R^{41}$ and $R^{42}$ include a trifluoromethyl group, a tetrafluoroethyl group, a pentafluoroethyl group, a heptafluoropropyl group, a hexafluorobutyl group, a nonafluorobutyl group, and the like. Of these, a perfluoroalkyl group such as a trifluoromethyl group, a pentafluoroethyl group or the like is preferable, and a trifluoromethyl group is more preferable.

The structural unit (I) including a group represented by the above formula (i-2) is preferably a structural unit represented by the following formula (2).

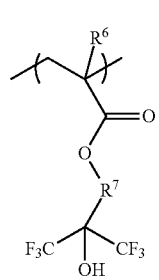

(2)

In the above formula (2), $R^6$ represents a hydrogen atom, a methyl group, a fluorine atom or a trifluoromethyl group; and $R^7$ represents a bivalent linking group.

Examples of the bivalent linking group represented by the $R^7$ include linear or branched bivalent hydrocarbon groups having 1 to 6 carbon atoms such as a methylene group, an ethylene group, a 1,3-propylene group, a 1,2-propylene group, a 1,1-propylene group, a 2,2-propylene group, a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group and a 2-methyl-1,4-butylene group; bivalent alicyclic hydrocarbon groups having 4 to 12 carbon atoms such as a 1,3-cyclobutylene group, a 1,3-cyclopentylene group, a 1,4-cyclohexylene group, a 1,5-cyclooctylene group, a 1,4-norbornylene group, a 2,5-norbornylene group, a 1,5-adamantylene group and a 2,6-adamantylene group, and the like. In addition, a methylene group (—CH₂—) in the hydrocarbon groups and the alicyclic hydrocarbon groups may be substituted with an oxygen atom, a carbonyl group or an ester group. Of these, $R^7$ preferably represents a linear or branched bivalent hydrocarbon group having 1 to 3 carbon atoms, a bivalent group including a norbornene skeleton, or a bivalent group including an adamantane skeleton.

The structural unit (I) including a group represented by the above formula (i-2) is exemplified by structural units represented by the following formulae (1-4), (1-8), (1-10), (1-12), (1-16) to (1-22), and the like. Of these, structural units represented by the following formulae (1-16) to (1-22) that are the structural units represented by the above formula (2) are preferred.

[Structure Unit (I) Including a Group Represented by the Above Formula (i-3)]

When the structural unit (I) includes a group represented by the above formula (i-3), a protective film formed from the composition for forming a protective film achieves superior effects against the OOB radiation and OG. Such structural units are exemplified by structural units represented by the following formulae (1-3), (1-11) and (1-13), and the like.

[Structure Unit (I) Including a Group Represented by the Above Formula (i-4)]

When the structural unit (I) includes a group represented by the above formula (i-4), a protective film formed from the composition for forming a protective film achieves superior effects against the OOB radiation and OG. Such structural units are exemplified by structural units represented by the following formulae (1-5) and (1-14), and the like.

[Structure Unit (I) Including a Group Represented by the Above Formula (i-5)]

When the structural unit (I) includes a group represented by the above formula (i-5), a protective film formed from the composition for forming a protective film achieves superior effects against the OOB radiation and OG.

In the above formula (i-5), $R^{43}$ represents a fluorine atom or an alkyl group, wherein a part or all of hydrogen atoms that the alkyl group has may be substituted by a fluorine atom.

For the alkyl group and the alkyl group substituted with an a fluorine atom represented by the $R^{43}$, details in connection with similar groups for the $R^{41}$ and $R^{42}$ may be adopted.

The structural unit (I) including a group represented by the above formula (i-5) is preferably a structural unit represented by the following formula (3).

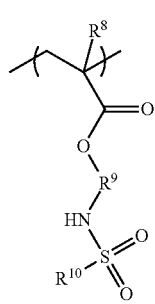

(3)

In the above formula (3), $R^8$ represents a hydrogen atom, a methyl group, a fluorine atom or a trifluoromethyl group; $R^9$ represents a bivalent linking group; and $R^{10}$ represents a fluorinated alkyl group having 1 to 20 carbon atoms.

For the bivalent linking group represented by the $R^9$, details in connection with the bivalent linking group represented by the $R^7$ may be adopted.

Examples of the fluorinated alkyl group having 1 to 20 carbon atoms represented by the $R^{10}$ include a trifluoromethyl group, a tetrafluoroethyl group, a pentafluoroethyl group, a heptafluoropropyl group, a hexafluorobutyl group, a nonafluorobutyl group, and the like.

The structural unit (I) including a group represented by the above formula (i-5) is exemplified by structural units represented by the following formulae (1-7), (1-15), (1-23), (1-24), and the like. Of these, structural units represented by the following formulae (1-23) and (1-24) that are structural units represented by the above formula (3) are preferred.

[Structure Unit (I) Including a Group Represented by the Above Formula (i-6)]

When the structural unit (I) includes a group represented by the above formula (i-6), a protective film formed from the composition for forming a protective film achieves superior effects against the OOB radiation and OG.

In the above formula (i-6), $R^{44}$ represents an aromatic group substituted with a fluorine atom or a fluorinated alkyl group, or a heteroaromatic group substituted with a fluorine atom or a fluorinated alkyl group.

The aromatic group substituted with a fluorine atom or a fluorinated alkyl group represented by the $R^{44}$ is exemplified by a group derived from an aromatic group such as a phenyl group, a naphthyl group or an anthryl group by substituting a part or all of hydrogen atoms that the group has by a fluorine atom or a fluorinated alkyl group, and the like.

The heteroaromatic group substituted with a fluorine atom or a fluorinated alkyl group represented by the $R^{44}$ is exemplified by a group derived from a heteroaromatic group such as a pyridinyl group, a furanyl group or a thiophenyl group by substituting apart or all of hydrogen atoms that the group has by a fluorine atom or a fluorinated alkyl group, and the like.

Examples of the fluorinated alkyl group include a fluorinated methyl group, a fluorinated ethyl group, and the like. Of these, a fluorinated methyl group is preferable, and a trifluoromethyl group is more preferred.

The structural unit (I) including a group represented by the above formula (i-6) is exemplified by structural units represented by the following formulae (1-1) and (1-2), and the like.

[Structure Unit (I) Including a Group Represented by the Above Formula (i-7)]

When the structural unit (I) includes a group represented by the above formula (i-7), a protective film formed from the composition for forming a protective film achieves superior effects against the OOB radiation and OG.

In the above formula (i-7), $R^{45}$ and $R^{46}$ each independently represent a hydrogen atom or an alkyl group, wherein a part or all of hydrogen atoms that the alkyl group has may be substituted by a fluorine atom.

The alkyl group represented by the $R^{45}$ and $R^{46}$ is each exemplified by a similar group to the group exemplified as the alkyl group represented by the $R^{41}$ and $R^{42}$, and the like.

The $R^{45}$ and $R^{46}$ preferably represent a hydrogen atom.

The structural unit (I) including a group represented by the above formula (i-7) is exemplified by structural units represented by the following formulae (1-25) and (1-26), and the like. Of these, a structural unit represented by the following formula (1-25) is preferable.

[Structure Unit (I) Including a Group Represented by the Above Formula (i-8)]

When the structural unit (I) includes a group represented by the above formula (i-8), a protective film formed from the composition for forming a protective film achieves superior effects against the OOB radiation and OG.

In the above formula (i-8), $R^{47}$ represents an alkyl group. The alkyl group represented by the $R^{47}$ is exemplified by a similar group to the group exemplified as the alkyl group represented by the $R^{41}$ and $R^{42}$, and the like.

The structural unit (I) including a group represented by the above formula (i-8) is exemplified by a structural unit represented by the following formula (1-9), and the like.

Examples of the structural unit (I) include structural unit represented by the following formulae, and the like.

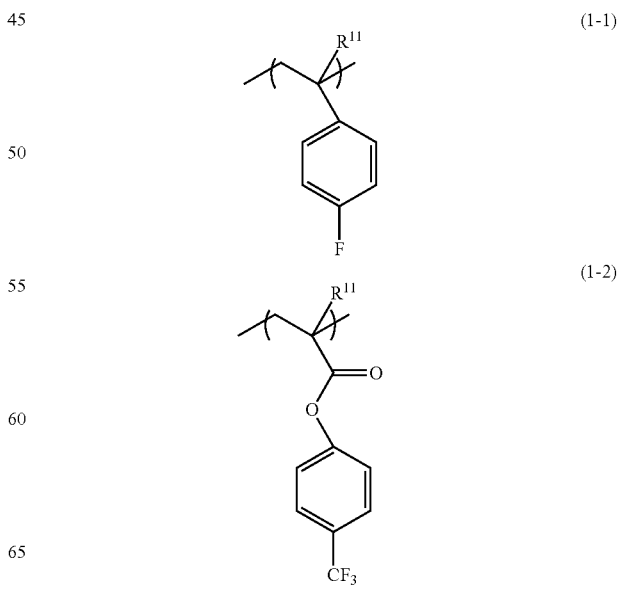

(1-3)
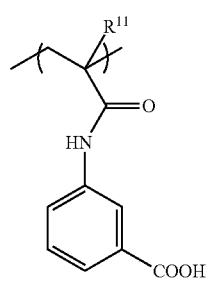
(1-4)
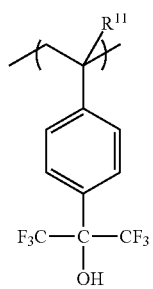
(1-5)
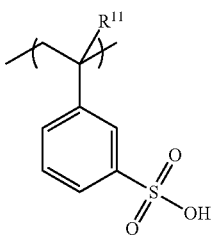
(1-6)
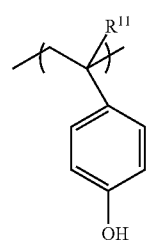
(1-7)
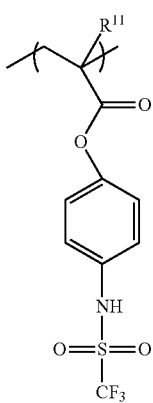
(1-8)
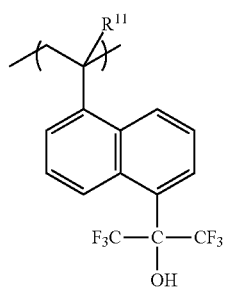
(1-9)
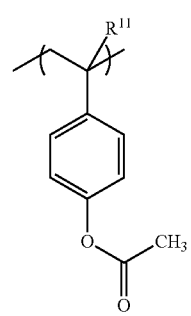
(1-10)
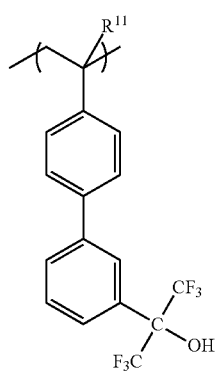
(1-11)
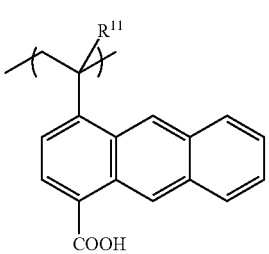
(1-12)
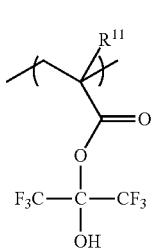

(1-13) 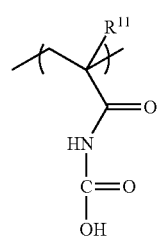
(1-14) 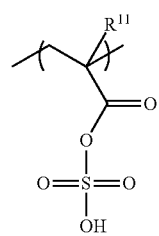
(1-15) 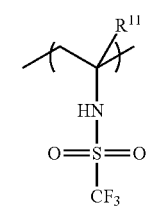
(1-16) 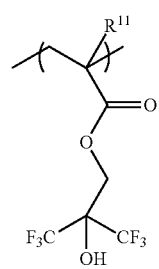
(1-17) 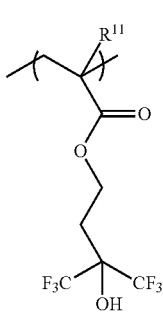
(1-18) 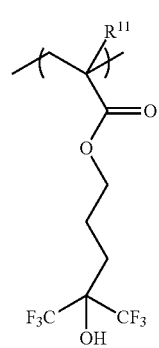
(1-19) 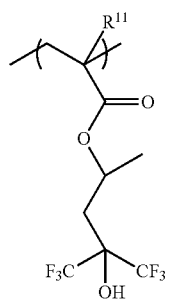
(1-20) 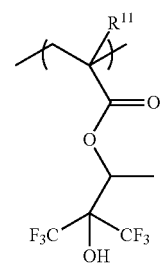
(1-21) 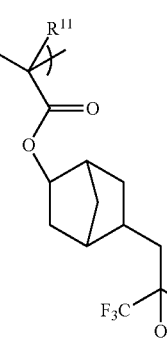
(1-22) 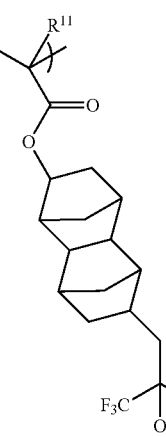
(1-23) 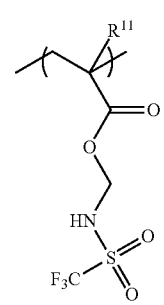

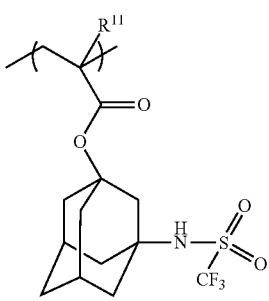
(1-24)
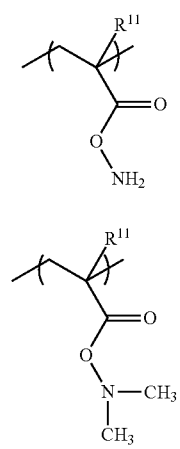
(1-25)
(1-26)
In the above formulae, $R^{11}$ represents a hydrogen atom, a fluorine atom, a methyl group or a trifluoromethyl group.
Monomers that provide the structural unit (I) are exemplified by compounds represented by the following formulae, and the like.
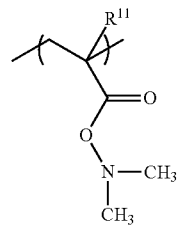
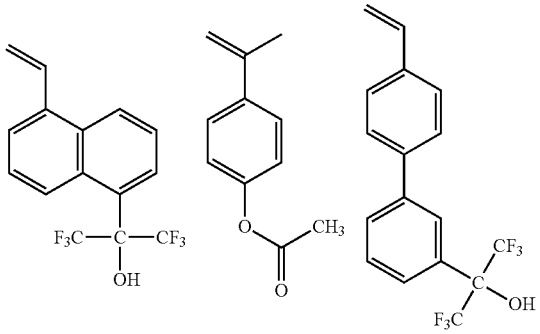
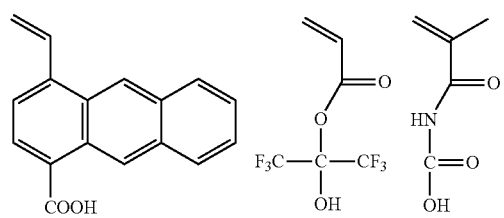
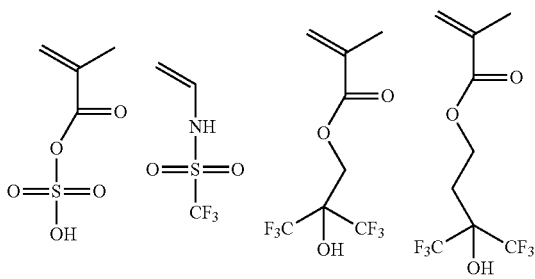
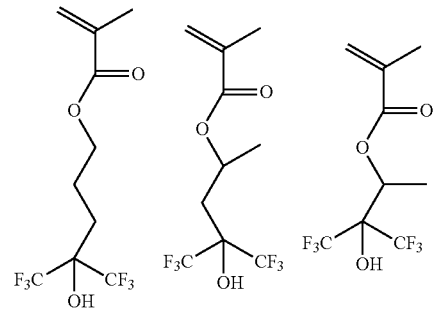
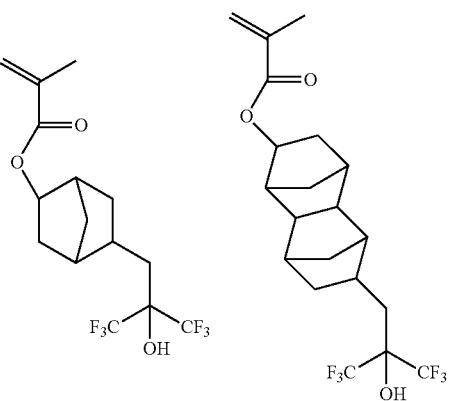

-continued

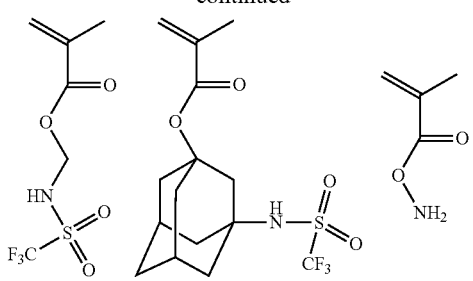

The content of the structural unit (I) in the polymer (A) is preferably no less than 50% by mole, more preferably no less than 70% by mole, and further preferably no less than 90% by mole. When the polymer (A) contains the structural unit (I) in the above specific range, the polymer (A) can efficiently absorb light having a wavelength of no less than 150 nm and no greater than 350 nm and thus can reduce influences from the OOB radiation. In addition, the polymer (A) achieves effects against also OG.

<Other Structure Units>

The polymer (A) may have in addition to the structural unit (I), a structural unit (II) represented by the following formula (4), any of structural units represented by formulae (c-6-1) to (c-6-3) in (C) a polymer described later, and the like as other structural unit, within the range not to impair the effects of the invention.

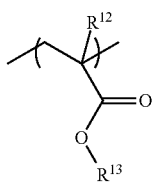

(4)

In the above formula (4), $R^{12}$ represents a hydrogen atom, a methyl group, a fluorine atom or a trifluoromethyl group; and $R^{13}$ represents a linear or branched fluorinated hydrocarbon group having 1 to 10 carbon atoms or a fluorinated alicyclic hydrocarbon group having 3 to 10 carbon atoms.

The fluorinated hydrocarbon and fluorinated alicyclic hydrocarbon group represented by the $R^{13}$ are preferably a linear or branched fluorinated hydrocarbon having 2 to 8 carbon atoms and a fluorinated alicyclic hydrocarbon group having 4 to 8 carbon atoms.

The structural unit (II) is exemplified by structural units represented by the following formulae (2-1) to (2-6).

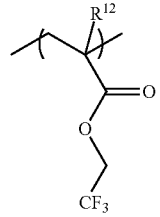 (2-1)

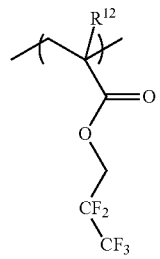 (2-2)

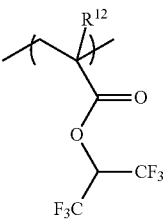 (2-3)

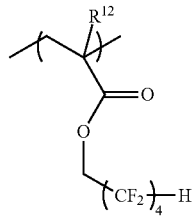 (2-4)

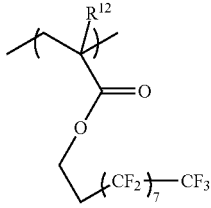 (2-5)

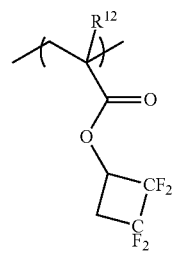 (2-6)

In the above formulae (2-1) to (2-6), $R^{12}$ is as defined in connection with the above formula (4).

The other structural unit in the polymer (A) is preferably structural units represented by the following formulae (c-6-1) to (c-6-3), and more preferably structural units represented by the following formulae (c-6-2) and (c-6-3).

<Synthesis Method of Polymer (A)>

The polymer (A) can be produced by, for example, polymerizing a monomer corresponding to each predetermined structural unit using a radical polymerization initiator in an appropriate solvent. The polymer (A) is preferably synthesized according to a method such as, e.g.: a method in which a solution containing a monomer and a radical initiator is added dropwise to a solution containing a reaction solvent or a monomer to permit a polymerization reaction; a method in which a solution containing a monomer, and a solution containing a radical initiator are each separately added dropwise to a solution containing a reaction solvent or a monomer to permit a polymerization reaction; and a method in which a plurality of types of solutions each containing a monomer, and a solution containing a radical initiator are each separately added dropwise to a solution containing a reaction solvent or a monomer to permit a polymerization reaction.

Examples of the solvent used for the polymerization include alkanes such as n-pentane, n-hexane, n-heptane, n-octane, n-nonane and n-decane; cycloalkanes such as cyclohexane, cycloheptane, cyclooctane, decalin and norbornane; aromatic hydrocarbons such as benzene, toluene, xylene, ethylbenzene and cumene; halogenated hydrocarbons such as chlorobutanes, bromohexanes, dichloroethanes, hexamethylene dibromide and chlorobenzene; saturated carboxylate esters such as ethyl acetate, n-butyl acetate, i-butyl acetate and methyl propionate; ketones such as acetone, 2-butanone, 4-methyl-2-pentanone, 2-heptanone and methyl ethyl ketone; ethers such as tetrahydrofuran and dimethoxy ethanes, diethoxyethanes; alcohols such as methanol, ethanol, 1-propanol, 2-propanol and 4-methyl-2-pentanol, and the like. These solvents may be used either alone or two types or more in combination thereof.

The reaction temperature in the polymerization may be appropriately determined depending on the type of the radical initiator, and is typically 40° C. to 150° C., and preferably 50° C. to 120° C. The reaction time is typically 1 hour to 48 hrs and preferably 1 hour to 24 hrs.

Examples of the radical initiator used for the polymerization include azobisisobutyronitrile (AIBN), 2,2'-azobis(4-methoxy-2,4-dimethylvaleronitrile), 2,2'-azobis(2-cyclopropyl propionitrile), 2,2'-azobis(2,4-dimethyl valeronitrile), 2,2'-azobis(2-methylpropionitrile), and the like. These initiators may be used by mixing two or more types thereof.

The polymer obtained by the polymerization reaction may be recovered preferably by a reprecipitation technique. More specifically, after the polymerization reaction is completed, the polymerization mixture is charged into a solvent for reprecipitation, whereby a target polymer is recovered in the form of powder. As the reprecipitation solvent, an alcohol, an alkane or the like may be used either alone or as a mixture of two or more thereof. Further, alternatively to the reprecipitation technique, liquid separating operation, column operation, ultrafiltration operation or the like may be employed to recover the polymer through eliminating low molecular components such as monomers and oligomers.

The weight average molecular weight (Mw) of the polymer (A) as determined by gel permeation chromatography (GPC) is preferably 1,000 to 100,000, more preferably 1,000 to 50,000 and further preferably 1,000 to 30,000. When the Mw of the polymer (A) falls within the specific range, a protective film superior in an inhibitory ability of the OOB radiation and OG can be formed.

The ratio (Mw/Mn) of the Mw of the polymer (A) to the number average molecular weight (Mn) is typically 1 to 5 and preferably 1 to 3. When the Mw of the polymer (A) falls within the specific range, a protective film superior in an inhibitory ability of the OOB radiation and OG can be formed.

It is to be noted that the Mw and Mn herein refer to values determined by gel permeation chromatography (GPC) using GPC columns (G2000HXL×2, G3000HXL×1 and G4000HXL×1, manufactured by Tosoh Corporation) with mono-dispersed polystyrene as a standard using a differential refractometer as a detector under the analysis conditions including a flow rate of 1.0 mL/min, an elution solvent of tetrahydrofuran, a sample concentration of 1.0% by mass, the amount of sample injected of 100 μL, and a column temperature of 40° C.

<(B) Organic Solvent>

The organic solvent (B) is not particularly limited as long as the organic solvent (B) can dissolve the polymer (A) and other optional components and makes the resist film component be less likely to be eluted. The organic solvent (B) is exemplified by alcohol type solvents, ether type solvents, ketone type organic solvents, amide type solvents, ester type organic solvents, hydrocarbon type solvent, and the like.

Examples of the alcohol type solvents include monoalcohol type solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, 4-methyl-2-pentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecylalcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol type solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

polyhydric alcohol partially etherified solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, and the like. Of these, 4-methyl-2-pentanol is preferable.

Examples of the ether type solvents include dipropyl ether, diisopropyl ether, butylmethyl ether, butylethyl ether, butylpropyl ether, dibutyl ether, diisobutyl ether, tert-butyl-methyl ether, tert-butylethyl ether, tert-butylpropyl ether, di-tert-butyl ether, dipentyl ether, diisoamyl ether, cyclopentylmethyl ether, cyclohexylmethyl ether, cyclopentylethyl ether, cyclohexylethyl ether, cyclopentylpropyl ether, cyclopentyl-2-propyl ether, cyclohexylpropyl ether, cyclohexyl-2-propyl ether, cyclopentylbutyl ether, cyclopentyl-tert-butyl ether, cyclohexylbutyl ether, cyclohexyl-tert-butyl ether, anisole, diethyl ether, diphenyl ether, and the like. Examples of cyclic ethers can include tetrahydrofuran, dioxane and the like. Of these, diisoamyl ether is preferable.

Examples of the ketone type solvent include acetone, methyl ethyl ketone, methyl-n-propyl ketone, methyl-n-butyl ketone, diethyl ketone, methyl-iso-butyl ketone, methyl-n-amyl ketone, ethyl-n-butyl ketone, methyl-n-hexyl ketone, di-iso-butyl ketone, trimethylnonanone, cyclopentanone, cyclohexanone, cycloheptanone, cyclooctanone, methylcyclohexanone, 2,4-pentanedione, acetonyl acetone and acetophenone.

Examples of the amide type solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester type solvents include diethyl carbonate, propylene carbonate, methyl acetate, ethyl acetate, γ-butyrolactone, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, acetic acid ethylene glycol monomethyl ether, acetic acid ethylene glycol monoethyl ether, acetic acid diethylene glycol monomethyl ether, acetic acid diethylene glycol monoethyl ether, acetic acid diethylene glycol mono-n-butyl ether, acetic acid propylene glycol monomethyl ether, acetic acid propylene glycol monoethyl ether, acetic acid propylene glycol monopropyl ether, acetic acid propylene glycol monobutyl ether, acetic acid dipropylene glycol monomethyl ether, acetic acid dipropylene glycol monoethyl ether, diacetic acid glycol, acetic acid methoxytriglycol, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon type solvents include aliphatic hydrocarbon type solvents such as n-pentane, iso-pentane, n-hexane, iso-hexane, n-heptane, iso-heptane, 2,2,4-trimethyl pentane, n-octane, iso-octane, cyclohexane and methylcyclohexane;

aromatic hydrocarbon type solvents such as benzene, toluene, xylene, mesitylene, ethylbenzene, trimethyl benzene, methylethylbenzene, n-propylbenzene, iso-propylbenzene, diethyl benzene, iso-butylbenzene, triethylbenzene, di-iso-propylbenzene and n-amyl naphthalene, and the like.

Of these, in light of being less likely to cause elution of a component from a resist film on which the composition for forming a protective film is coated, the organic solvent (B) is preferably an alcohol type solvent and an ether type solvent, and more preferably at least one type of solvent selected from the group consisting of an ether type solvent and an alcohol type solvent. Furthermore, it is particularly preferable that the organic solvent (B) contains an ether type solvent and the content of the ether type solvent is no less than 20% by mass. It is to be noted that these organic solvents may be used either alone, or two or more types in combination thereof.

<Other Optional Components>

The composition for forming a protective film may contain other optional components in addition to the polymer (A) and the organic solvent (B) within the range not to impair the effects of the invention. Other optional components are exemplified by an acid diffusion control agent, an acid generating agent, and the like.

[Acid Diffusion Control Agent]

The acid diffusion control agent has an effect of inhibiting diffusion of an acid generated in a resist film into a light-unexposed site through a protective film, and diffusion of an acid diffusion control agent in a resist film into a protective film by a concentration gradient. As the acid diffusion control agent, a similar acid diffusion control agent to that capable of being used in a photoresist composition described later can be used.

[Acid Generating Agent]

The acid generating agent has an effect of compensating for lack of an acid in a resist film that occurs by diffusion into a protective film, of an acid to be contributory to a deprotection reaction in the resist film.

<Preparation Method of Composition for Forming a Protective Film>

The composition for forming a protective film is prepared by, for example, mixing the polymer (A) and other optional components at a predetermined proportion in the organic solvent (B). In addition, the composition for forming a protective film may be prepared in a state in which the composition for forming a protective film is dissolved or dispersed in the organic solvent (B) that is appropriate and may be used. The obtained mixed liquid may be filtrated through a membrane filter having a pore size of 0.2 μm, etc. as needed.

<Photoresist Composition>

As a photoresist composition used for the method for forming a resist pattern of the embodiment of the present invention, conventionally well-known photoresist compositions can be used. Of these, a polymer having a structural unit including an acid-dissociable group (hereinafter, may be also referred to as "(C) a polymer"), and a chemical amplification type photoresist composition containing an acid generator is preferable. In addition, the photoresist composition more preferably contains an acid diffusion control agent and a solvent. Furthermore, the photoresist composition may contain other optional components as long as the effects of the invention are not impaired. Hereinafter, each component will be described in detail.

<(C) Polymer>

The structural unit including an acid-dissociable group that the polymer (C) has is not particularly limited as long as a group that dissociates by an action of an acid is included, and is preferably a structural unit (P-I) represented by the following formula (p-1) and/or a structural unit (P-II) represented by the following formula (p-2). In addition, the polymer (C) may have another structural unit (hereinafter, may be also referred to as "structural unit (P-III)") having an acid-dissociable group other than the structural unit (P-I) and the structural unit (P-II). When the polymer (C) has such a structural unit, favorable sensitivity is obtained. Furthermore, the polymer (C) preferably contains as other structural unit other than the structural unit having an acid-dissociable group, at least one type of structural units represented by the following formulae (c-1-1) to (c-1-4), structural units represented by the following formulae (c-2-1) to (c-2-2), structural units represented by the following formulae (c-3-1) to (c-3-2), structural units represented by the following formulae (c-4-1) to (c-4-2), structural units represented by the following formulae (c-5-1) to (c-5-2), structural units represented by the following formulae (c-6-1) to (c-6-3), structural units represented by the following formulae (c-7-1) to (c-7-2), and the structural unit (I) in the polymer (A). Hereinafter, each structural unit will be described in detail. It is to be noted that the polymer (C) may have only one type or at least two types of each of the structural units.

[Structure Unit (P-I)]

The structural unit (P-I) is represented by the following formula (p-1):

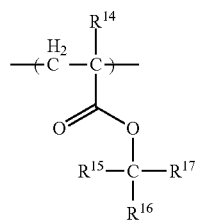
(p-1)

in the above formula (p-1), $R^{14}$ represents a hydrogen atom, a fluorine atom, a methyl group, a trifluoromethyl group or a hydroxymethyl group; and $R^{15}$ to $R^{17}$ each independently represent a linear or branched alkyl group having 1 to 4 carbon atoms, an aryl group having 6 to 22 carbon atoms or a monovalent alicyclic hydrocarbon group having 4 to 20 carbon atoms or a group derived therefrom, wherein any two of $R^{15}$ to $R^{17}$ may taken together represent a bivalent alicyclic hydrocarbon group or a group derived therefrom together with the carbon atom to which the any two of $R^{15}$ to $R^{17}$ bond.

Examples of the linear or branched alkyl group represented by the $R^{15}$ to $R^{17}$ having 1 to 4 carbon atoms include a methyl group, an ethyl group, an n-butyl group, an i-butyl group, and the like.

Examples of the aryl group having 6 to 22 carbon atoms represented by the $R^{15}$ to $R^{17}$ include a phenyl group, a naphthyl group, and the like.

Examples of the monovalent alicyclic hydrocarbon group having 4 to 20 carbon atoms represented by the $R^{15}$ to $R^{17}$ include a cyclobutyl group, a cyclopentyl group, a cyclohexyl group, a cyclooctyl group, a norbornyl group, an adamantyl group, and the like. In addition, the group derived therefrom is exemplified by a group derived by substituting a part or all of hydrogen atoms that the alicyclic hydrocarbon group has by a substituent.

Examples of the bivalent alicyclic hydrocarbon group that may be represented by any two of $R^{15}$ to $R^{17}$ taken together with the carbon atom to which they bond include a cyclobutanediyl group, a cyclopentanediyl group, a cyclohexanediyl group, and the like. In addition, the group derived therefrom is exemplified by a group derived by substituting a part or all of hydrogen atoms that the alicyclic hydrocarbon group has by a substituent.

Of the structural unit (P-I), structural units represented by the following formulae (p-1-1) to (p-1-7) are preferable and structural unit represented by the following formula (p-1-2), (p-1-3) or (p-1-4) is further preferable. When the polymer (C) contains such a structural unit, a resist pattern superior in nanoedge roughness can be formed.

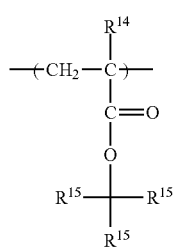
(p-1-1)

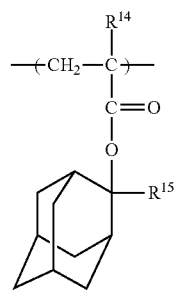
(p-1-2)

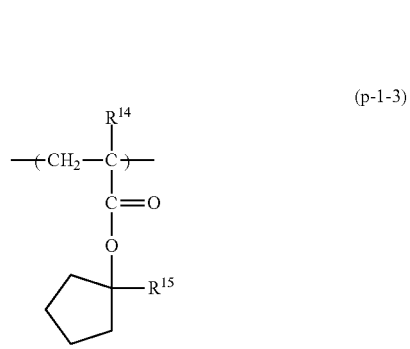
(p-1-3)

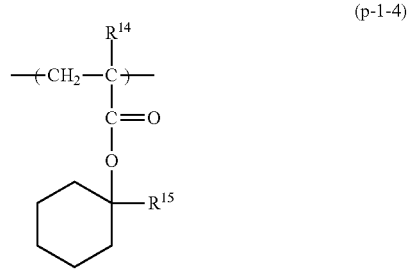
(p-1-4)

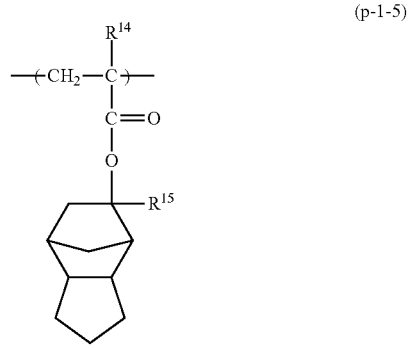
(p-1-5)

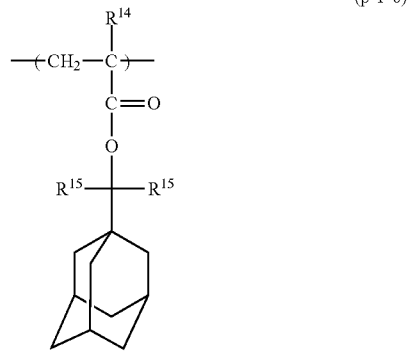
(p-1-6)

(p-1-7)

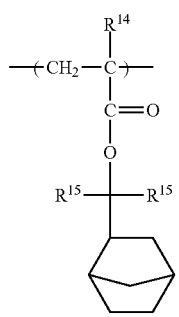

In the above formulae (p-1-1) to (p-1-7), $R^{14}$ is as defined in connection with the above formula (p-1); and $R^{15}$ each independently represents a linear or branched alkyl group having 1 to 4 carbon atoms, or an aryl group having 6 to 22 carbon atoms.

[Structure Unit (P-II)]

The structural unit (P-II) is represented by the following formula (p-2):

(p-2)

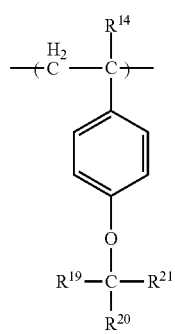

in the above formula (p-2), $R^{18}$ represents a hydrogen atom, a methyl group, a trifluoromethyl group or a hydroxymethyl group; and $R^{19}$ to $R^{21}$ each independently represent a linear or branched alkyl group having 1 to 4 carbon atoms, an aryl group having 6 to 22 carbon atoms, or a monovalent alicyclic hydrocarbon group having 4 to 20 carbon atoms or a group derived therefrom, wherein any two of $R^{19}$ to $R^{21}$ may taken together represent a bivalent alicyclic hydrocarbon group or a group derived therefrom together with the carbon atom to which the any two of $R^{19}$ to $R^{21}$ bond.

For each of the linear or branched alkyl group having 1 to 4 carbon atoms, the monovalent alicyclic hydrocarbon group having 4 to 20 carbon atoms or the group derived therefrom represented by $R^{19}$ to $R^{21}$, and the bivalent alicyclic hydrocarbon group that may be represented by any two of $R^{19}$ to $R^{21}$ taken together with the carbon atom to which they bond or the group derived therefrom, details in connection with the similar groups as those represented by $R^{15}$ to $R^{17}$ in the above formula (p-1) may be adopted.

Of the structural unit (P-II), a structural unit represented by the following formula (p-2-1) is preferable. When the polymer (C) includes such a structural unit, a resist pattern more superior in nanoedge roughness can be formed.

(p-2-1)

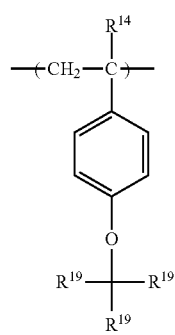

In the above formula (p-2-1), $R^{18}$ is as defined in connection with the above formula (p-2); and $R^{19}$ each independently represents a linear or branched alkyl group having 1 to 4 carbon atoms.

[Structure Unit (P-III)]

The structural unit (P-III) is exemplified by structural units represented by the following formulae (p-3-1) to (p-3-4), and the like.

(p-3-1)

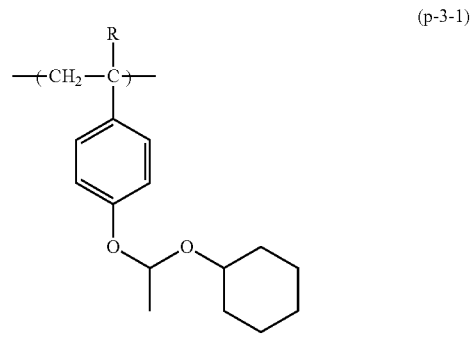

(p-3-2)

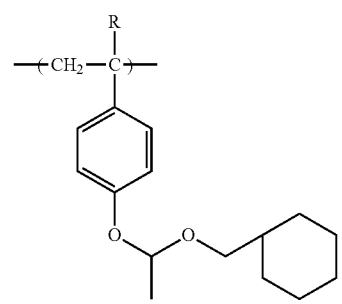

(p-3-3)

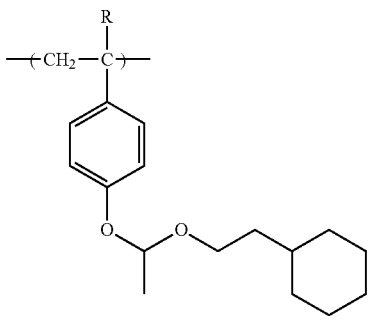

(p-3-4)

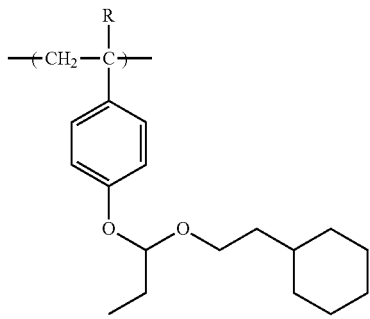

[Other Structure Units]

It is preferred that the polymer (C) further has at least one type of structural unit of structural units represented by the following formulae (c-1-1) to (c-1-4), (c-2-1) to (c-2-2), (c-3-1) to (c-3-2), (c-4-1) to (c-4-2), (c-5-1) to (c-5-2), (c-6-1) to (c-6-3), (c-7-1) to (c-7-2) and the structural unit (I) in the polymer (A). Other structural units are preferably structural units represented by the following formulae (c-5-1) to (c-5-2), (c-6-1) to (c-6-3), (c-7-1) to (c-7-2) and the structural unit (I) of these structural units, and more preferably the structural unit (I).

(c-1-1)

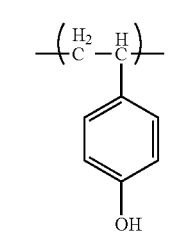

(c-1-2)

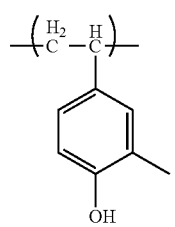

(c-1-3)

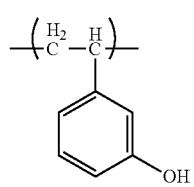

(c-1-4)

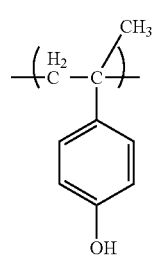

(c-2-1)

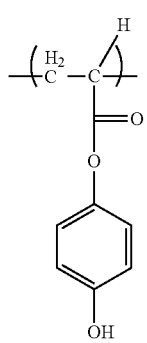

(c-2-2)

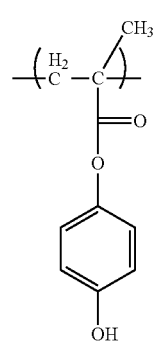

(c-3-1)

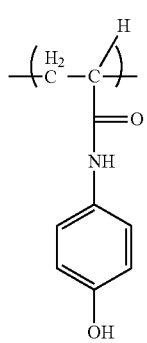

(c-3-2)

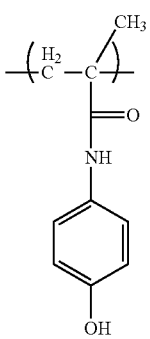

-continued (c-4-1) 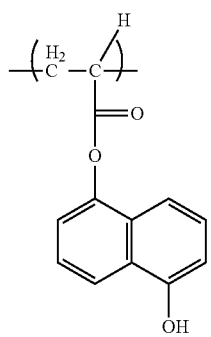

(c-4-2) 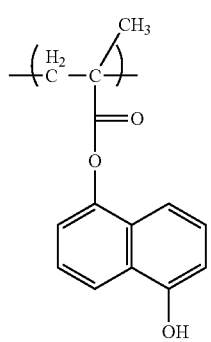

(c-5-1) 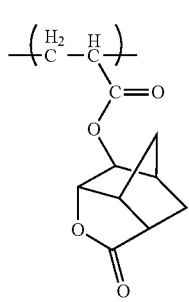

(c-5-2) 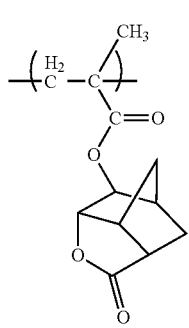

(c-6-1) 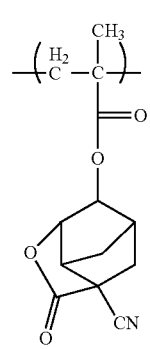

-continued (c-6-2) 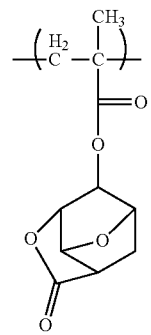

(c-6-3) 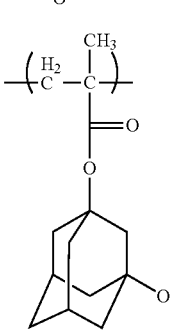

(c-7-1) 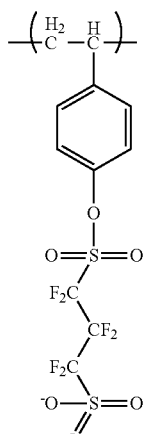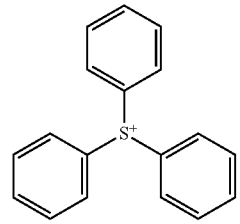

(c-7-2) 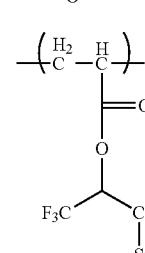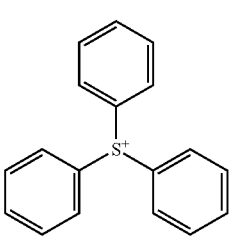

It is to be noted that in the polymer (C) the total content of the structural units (P-I), (P-II) and (P-III) including an acid-dissociable group is preferably 10% by mole to 80% by mole, more preferably 15% by mole to 80% by mole, and further preferably 20% by mole to 70% by mole with respect to the total of the structural units that constitute the polymer (C). When the content of the structural units including an acid-dissociable group falls within the range, sufficiently satisfactory basic properties such as sensitivity can be obtained.

<Synthesis Method of Polymer (C)>

The polymer (C) can be produced by, for example, polymerizing a monomer corresponding to each predetermined structural unit in an appropriate solvent using a radical polymerization initiator in an appropriate solvent. It is to be noted that the polymerization initiator, the solvent and the like used for the synthesis of the polymer (C) are exemplified by similar polymerization initiator, solvent and the like to those exemplified in the synthesis method of the polymer (A).

The reaction temperature in the polymerization is typically 40° C. to 150° C. and preferably 50° C. to 120° C. The reaction time is typically 1 hour to 48 hrs and preferably 1 hour to 24 hrs.

The weight average molecular weight (Mw) in terms of polystyrene equivalent of the polymer (C) by a gel permeation chromatography (GPC) method is preferably 1,000 to 50,000, more preferably 1,000 to 30,000 and further preferably 1,000 to 10,000.

The ratio (Mw/Mn) of the Mw of the polymer (C) to the number average molecular weight (Mn) in terms of polystyrene equivalent by the GPC method is typically 1 to 3 and preferably 1 to 2.

<Acid Generator>

The photoresist composition preferably contains an acid generator together with the polymer (C). The acid generator is a compound that generates an acid by irradiation with extreme ultraviolet (EUV) light or an electron beam in the exposure step in the method for forming a resist pattern. By an action of the acid, the acid-dissociable group present in the polymer (C) dissociates, whereby a polar group such as a carboxy group or a phenolic hydroxyl group is generated. As a result, the polymer (C) becomes readily soluble in an alkaline developer. The form of the acid generator contained in the method for forming a resist pattern may be a form of compound as described later (hereinafter, may be also appropriately referred to as "acid generating agent"), a form in which the acid generator is incorporated as a part of a polymer, or both of them.

Examples of the acid generating agent include an onium salt compound, a sulfonimide compound, a halogen-containing compound, a diazo ketone compound, and the like. Of these, an onium salt compound is preferable.

Examples of the onium salt compound include a sulfonium salt (including a tetrahydrothiophenium salt), an iodonium salt, a phosphonium salt, a diazonium salt, a pyridinium salt, and the like. Of these, a sulfonium salt is preferable.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate,
4-cyclohexylphenyldiphenylsulfonium trifluoromethanesulfonate,
4-cyclohexylphenyldiphenylsulfonium nonafluoro-n-butanesulfonate,
4-cyclohexylphenyldiphenylsulfonium perfluoro-n-octanesulfonate,
4-cyclohexylphenyldiphenylsulfonium 2-bicyclo[2.2.1]hept-2-yl-1,1,2,2-tetrafluoroethanesulfonate,
4-cyclohexylphenyldiphenylsulfonium camphorsulfonate,
4-methanesulfonylphenyldiphenylsulfonium trifluoromethanesulfonate,
4-methanesulfonylphenyldiphenylsulfonium nonafluoro-n-butanesulfonate,
4-methanesulfonylphenyldiphenylsulfonium perfluoro-n-octanesulfonate,
4-methanesulfonylphenyldiphenylsulfonium 2-bicyclo[2.2.1]hept-2-yl-1,1,2,2-tetrafluoroethanesulfonate,
4-methanesulfonylphenyldiphenylsulfonium camphorsulfonate,
triphenylsulfonium 2-(i-adamantyl)-1,1-difluoroethanesulfonate,
triphenylsulfonium 6-(i-adamantylcarbonyloxy)-1,1,2,2-tetrafluorohexane-1-sulfonate,
triphenylsulfonium 6-(i-adamantylcarbonyloxy)-1,1,2-trifluorobutane-1-sulfonate,
triphenylsulfonium 2-(4-oxo-1-adamantylcarbonyloxy)-1,1,3,3,3-pentafluoropropane-1-sulfonate, triphenylsulfonium 2-bicyclo[2.2.1]hept-2-yl-1,1-difluoroethanesulfonate,
and the like.

Of these, 4-cyclohexylphenyldiphenylsulfonium nonafluoro-n-butanesulfonate, triphenylsulfonium trifluoromethanesulfonate, triphenylsulfonium nonafluoro-n-butanesulfonate, triphenylsulfonium 2-(i-adamantyl)-1,1-difluoroethanesulfonate, triphenylsulfonium 6-(i-adamantylcarbonyloxy)-1,1,2,2-tetrafluorohexane-1-sulfonate, triphenylsulfonium 6-(i-adamantylcarbonyloxy)-1,1,2-trifluorobutane-1-sulfonate,
triphenylsulfonium 2-(4-oxo-1-adamantylcarbonyloxy)-1,1,3,3,3-pentafluoropropane-1-sulfonate, and triphenylsulfonium 2-bicyclo[2.2.1]hept-2-yl-1,1-difluoroethanesulfonate are preferable.

Examples of the tetrahydrothiophenium salt include
1-(4-n-butoxynaphthalen-1-yl)tetrahydrothiophenium trifluoromethanesulfonate,
1-(4-n-butoxynaphthalen-1-yl)tetrahydrothiophenium nonafluoro-n-butanesulfonate,
1-(4-n-butoxynaphthalen-1-yl)tetrahydrothiophenium perfluoro-n-octanesulfonate,
1-(4-n-butoxynaphthalen-1-yl)tetrahydrothiophenium 2-bicyclo[2.2.1]hept-2-yl-1,1,2,2-tetrafluoroethanesulfonate,
1-(4-n-butoxynaphthalen-1-yl)tetrahydrothiophenium camphorsulfonate,
1-(6-n-butoxynaphthalen-2-yl)tetrahydrothiophenium trifluoromethanesulfonate,
1-(6-n-butoxynaphthalen-2-yl)tetrahydrothiophenium nonafluoro-n-butanesulfonate,
1-(6-n-butoxynaphthalen-2-yl)tetrahydrothiophenium perfluoro-n-octanesulfonate,
1-(6-n-butoxynaphthalen-2-yl)tetrahydrothiophenium 2-bicyclo[2.2.1]hept-2-yl-1,1,2,2-tetrafluoroethanesulfonate,
1-(6-n-butoxynaphthalen-2-yl)tetrahydrothiophenium camphorsulfonate,
1-(3,5-dimethyl-4-hydroxyphenyl)tetrahydrothiophenium trifluoromethanesulfonate,
1-(3,5-dimethyl-4-hydroxyphenyl)tetrahydrothiophenium nonafluoro-n-butanesulfonate,
1-(3,5-dimethyl-4-hydroxyphenyl)tetrahydrothiophenium perfluoro-n-octanesulfonate,
1-(3,5-dimethyl-4-hydroxyphenyl)tetrahydrothiophenium 2-bicyclo[2.2.1]hept-2-yl-1,1,2,2-tetrafluoroethanesulfonate,
1-(3,5-dimethyl-4-hydroxyphenyl)tetrahydrothiophenium camphorsulfonate, and the like. Of these,
1-(4-n-butoxynaphthalene-1-yl)tetrahydrothiophenium nonafluoro-n-butanesulfonate,
1-(4-n-butoxynaphthalene-1-yl)tetrahydrothiophenium perfluoro-n-octanesulfonate,
1-(4-n-butoxynaphthalene-1-yl)tetrahydrothiophenium 2-bicyclo[2.2.1]hept-2-yl-1,1,2,2-tetrafluoroethanesulfonate and 1-(3,5-dimethyl-4-hydroxyphenyl)tetrahydrothiophenium nonafluoro-n-butanesulfonate are preferable.

It is to be noted that the form in which the acid generator is incorporated as a part of the polymer is exemplified by a form having the structural unit represented by the above formulae (c-7-1) and (c-7-2) in the polymer (C), and the like.

The amount of the acid generator used in the photoresist composition is, in light of securing sensitivity and developability as a resist, typically no less than 0.1 parts by mass and no greater than 40 parts by mass, and preferably no less than 0.5 parts by mass and no greater than 30 parts by mass with respect to 100 parts by mass of the polymer (C) as an amount used when the acid generator is an acid generating agent. When the amount of the acid generating agent used is less than 0.1 parts by mass, sensitivity may deteriorate, whereas when the amount of the acid generating agent used exceeds 40 parts by mass, transparency for radioactive rays may be lowered, whereby a desired resist pattern is less likely to be obtained. The content in the case in which the acid generator is present in the form in which the acid generator is incorporated as a part of the polymer is preferably no less than 0.5% by mole and no greater than 30% by mole, and more preferably no less than 1% by mole and no greater than 20% by mole with respect to the total of the structural unit that constitutes the polymer (C).

<Acid Diffusion Controller>

An acid diffusion controller is a component that achieves effects of controlling a diffusion phenomenon of an acid generated from an acid generator by exposure in a resist film and inhibiting unfavorable chemical reactions at light-unexposed sites. When the photoresist composition contains an acid diffusion controller, storage stability of the obtained photoresist composition is further enhanced and resolution as a resist is further enhanced. In addition, a change in a line width of a resist pattern by a fluctuation of post-exposure time delay between exposure and a development treatment can be inhibited, whereby a composition extremely superior in process stability can be obtained. It is to be noted that the form of the acid diffusion controller contained in the photoresist composition of the embodiment of the present invention may be a form of a free compound (hereinafter, may be also appropriately referred to as "acid diffusion control agent"), a form in which the acid diffusion controller is incorporated as a part of a polymer, or both of them.

Examples of the acid diffusion control agent include an amine compound, an amide group-containing compound, a urea compound, a nitrogen-containing heterocyclic compound, and the like.

Examples of the amine compound include mono(cyclo) alkylamines; di(cyclo)alkylamines; tri(cyclo)alkylamines; substituted alkylaniline and derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(i-(4-aminophenyl)-1-methylethyl)benzene, 1,3-bis(i-(4-aminophenyl)-1-methylethyl)benzene, bis(2-dimethylaminoethyl)ether, bis(2-diethylaminoethyl) ether,
1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, triethanolamine, and the like. Of these, triethanolamine is preferable.

Examples of the amide group-containing compound include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl) isocyanurate, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include imidazoles; pyridines; piperazines; pyrazine, pyrazole, pyridazine, quinoxaline, purine, pyrrolidine, piperidine,
N-(t-amyloxycarbonyl)-4-hydroxypiperidine, piperidine ethanol,
3-piperidino-1,2-propanediol, morpholine,
N-(t-butoxycarbonyl)-2-hydroxymethylpyrrolidine,
4-methylmorpholine, 1-(4-morpholinyl)ethanol,
4-acetylmorpholine, 3-(N-morpholino)-1,2-propane diol,
1,4-dimethylpiperazine, 1,4-diazabicyclo[2.2.2]octane,
N-(t-butoxycarbonyl)-2-phenylbenzoimidazole, and the like.
Of these, N-(t-amyloxycarbonyl)-4-hydroxypiperidine,
N-(t-butoxycarbonyl)-2-hydroxymethylpyrrolidine,
N-(t-butoxycarbonyl)-2-phenylbenzoimidazole and 2,4,5-triphenylimidazole are preferable.

In addition, as the acid diffusion control agent, a photodegradable base that generates a weak acid through sensitization upon exposure can be also used. The photodegradable base generates an acid at light-exposed sites, whereby insolubility of the polymer (A) in the developer solution can be enhanced. On the other hand, the photodegradable base exerts a high acid-capturing function by an anion at light-unexposed sites and serves as a quencher, and captures the acid diffused from light-exposed sites. In other words, since the photodegradable base serves as a quencher at only light-unexposed sites, the contrast in a deprotection reaction is improved, and as a result, resolution can be further improved. Exemplary photodegradable base includes onium salt compounds that lose acid-diffusion controllability through degradation due to an exposure. The onium salt compound is exemplified by a sulfonium salt compound represented by the following formula (5), an iodonium salt compound represented by the following formula (6), and the like.

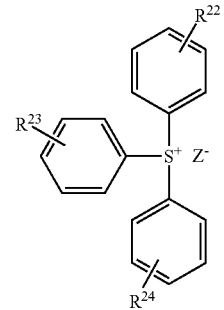

(5)

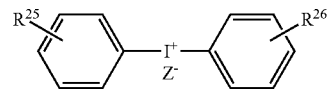

(6)

In the above formula (5) and formula (6), $R^{22}$ to $R^{26}$ each independently represent a hydrogen atom, an alkyl group, an alkoxy group, a hydroxyl group, a halogen atom or —$SO_2$—$R^C$; $R^C$ represents an alkyl group, a cycloalkyl group, an alkoxy group or an aryl group; and $Z^-$ represents OH$^-$, $R^{27}$—COO$^-$, $R^D$—$SO_2$—$N^-$—$R^{27}$, $R^{27}$—$SO_3^-$ or an anion represented by the following formula (7), wherein $R^{27}$ represents a linear or branched alkyl group having 1 to 10 carbon atoms, a cycloalkyl group having 3 to 20 carbon atoms, an aryl group having 6 to 30 carbon atoms, or an alkaryl group having 7 to 30 carbon atoms, and a part or all of hydrogen atoms in the alkyl group, the cycloalkyl group, the aryl group and the alkaryl group may be substituted; and $R^D$ represents a linear or branched alkyl group having 1 to 10 carbon atoms or a cycloalkyl group having 3 to 20 carbon atoms and these optionally have a substituent, wherein a part or all of hydrogen atoms in the alkyl group and the cycloalkyl group may be substituted by a fluorine atom, and provided that $Z^-$ represents $R^{27}$—$SO_3^-$, any case where a fluorine atom binds to the carbon atom to which $SO_3^-$ bond is excluded.

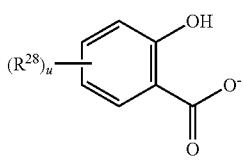
(7)

In the above formula (7), $R^{28}$ represents a linear or branched alkyl group having 1 to 12 carbon atoms in which a part or all of hydrogen atoms are substituted by a fluorine atom, or a linear or branched alkoxy group having 1 to 12 carbon atoms; and u is an integer of 0 to 2.

The photodegradable base is exemplified by compounds represented by the following formulae, and the like.

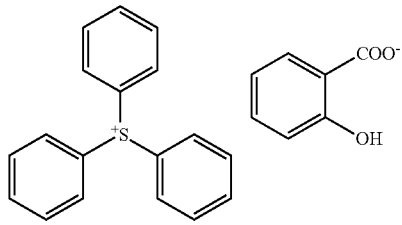

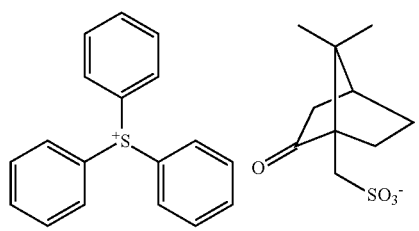

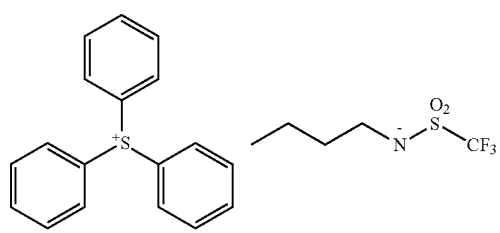

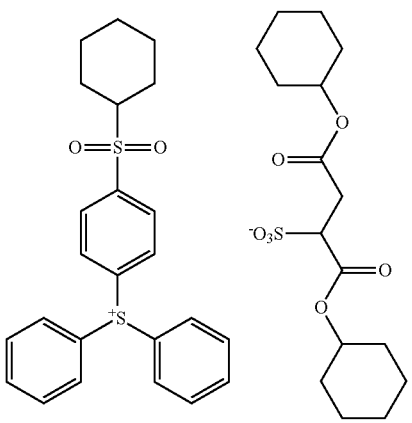

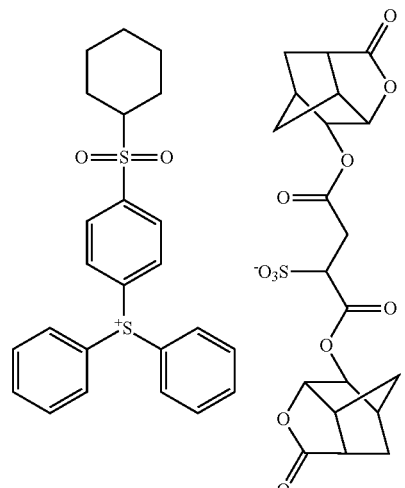

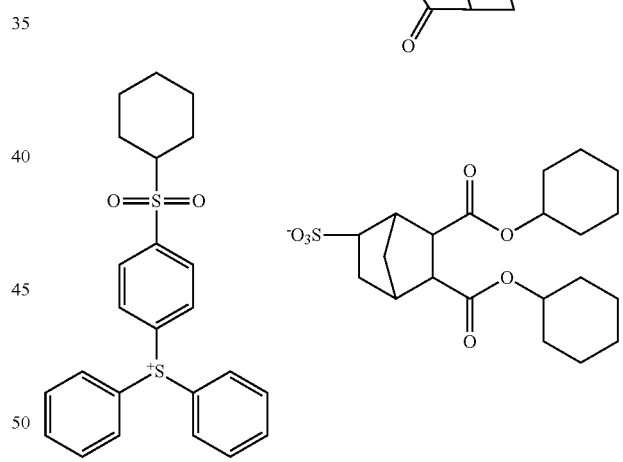

The content of the acid diffusion control agent in a photoresist composition used for the method for forming a resist pattern is preferably less than 10 parts by mass with respect to 100 parts by mass of the polymer (C). When the total amount used exceeds 10 parts by mass, sensitivity as a resist may be deteriorated. These acid diffusion control agent may be used either alone, or in combination of two or more types thereof.

<Solvent>

The photoresist composition used for the method for forming a resist pattern typically contains a solvent. The solvent is not particularly limited as long as the solvent can dissolve at least the polymer (C), the acid generator, the acid diffusion control agent, and other optional components described later.

Examples of the solvent include an alcohol type solvent, an ether type solvent, a ketone type solvent, an amide type solvent, an ester type solvent and a mixed solvent thereof, and the like.

Specific examples of the solvent include similar organic solvents to those exemplified as the organic solvent (B) contained in the composition for forming a protective film. Of these, propylene glycol monomethyl ether acetate and ethyl lactate are preferable. These solvents may be used either alone, or two types or more in combination thereof.

<Other Optional Components>

The photoresist composition used for the method for forming a resist pattern can contain a surfactant, an alicyclic skeleton-containing compound, a sensitizer, and the like as other optional components. It is to be noted that the photoresist composition may contain only one type of the other optional components or two or more types of the other optional components.

[Surfactant]

The surfactant achieves an effect of improving coating properties, striation, developability, and the like of the photoresist composition used for a method for forming a resist pattern.

[Alicyclic Skeleton-Containing Compound]

The alicyclic skeleton-containing compound achieves an effect of ameliorating dry etching resistance, pattern configuration, adhesiveness to a substrate of the photoresist composition used for the method for forming a resist pattern.

[Sensitizer]

The sensitizer exhibits an action of increasing the amount of formation of an acid from the acid generator (B) and achieves an effect of enhancing "apparent sensitivity" of the photoresist composition used for the method for forming a resist pattern.

<Preparation Method of a Photoresist Composition>

The photoresist composition used for the method for forming a resist pattern may be prepared by, for example, mixing the polymer (C), the acid generator, the acid diffusion control agent and other optional components at each predetermined proportion in the solvent. Also, the photoresist composition can be prepared and used in a state being dissolved or dispersed in an appropriate solvent.

EXAMPLES

Hereinafter, the present invention will be specifically explained by way of Examples, but the present invention is not limited to these Examples.

<Synthesis of (A) Polymer>

Monomers used for the synthesis of the polymer (A) and the polymer (C) described later are represented by the following formulae.

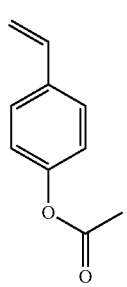

(M-1)

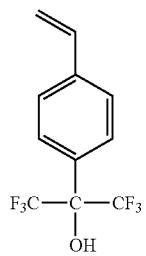

(M-2)

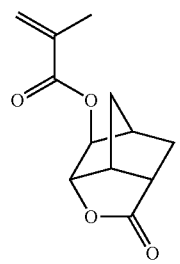

(M-3)

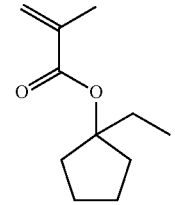

(M-4)

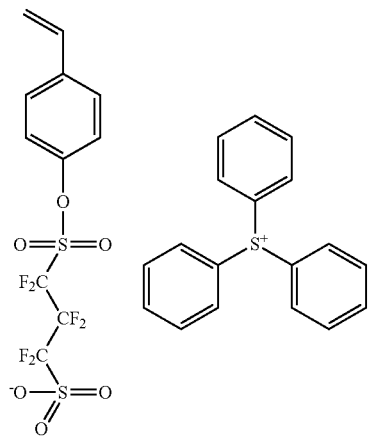

(M-5)

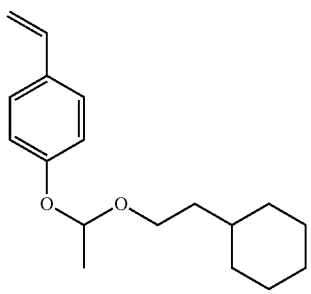

(M-6)

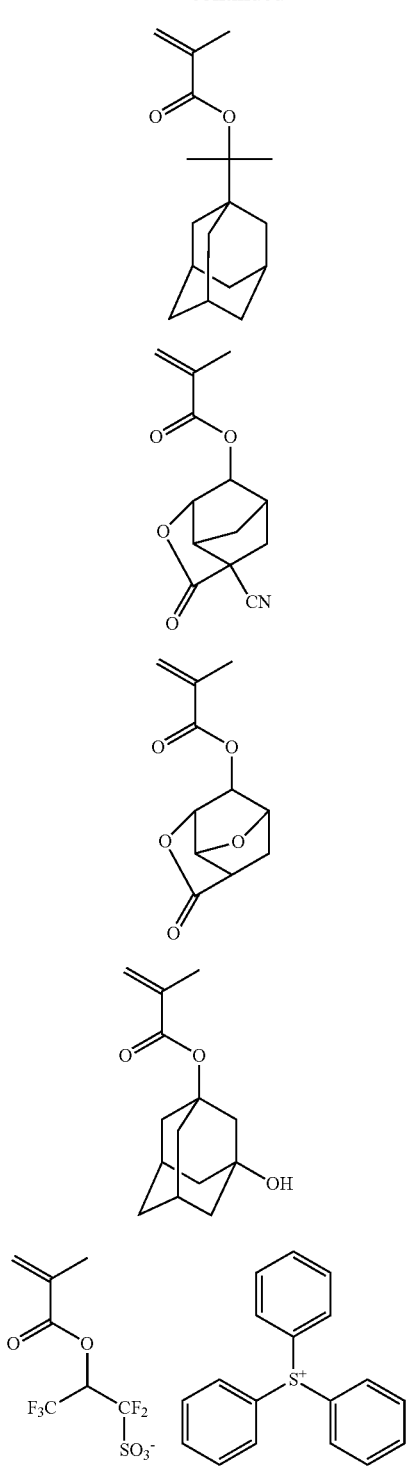

Synthesis Example 1

After 100 g of a compound represented by the above formula (M-1) that provides the structural unit (I), 2.4 g of azobisisobutyronitrile (AIBN), and 0.4 g of t-dodecyl mercaptan were dissolved into 200 g of propylene glycol monomethyl ether, the mixture was subjected to polymerization for 6 hrs under a nitrogen atmosphere while the reaction temperature was maintained at 70° C. After the polymerization, propylene glycol monomethyl ether was distilled in vacuo, and the obtained polymer was dissolved into 100 g of methyl ethyl ketone, followed by addition of the obtained polymer dropwise to 2,000 g of n-hexane to permit solidification purification of the polymer. Next, to the polymer was added 150 g of propylene glycol monomethyl ether again, and then 150 g of methanol, 41 g of triethylamine and 8 g of water were further added. The mixture was subjected to a hydrolysis reaction for 8 hrs while refluxing at a boiling point.

After it was ascertained by infrared spectrometry that deacetylation quantitatively proceeded and poly(p-hydroxystyrene) was obtained, the solvent and the triethylamine were distilled in vacuo. The obtained polymer was dissolved in 150 g of acetone, which was thereafter added dropwise to 2,000 g of water to permit solidification, and the generated white powder was filtered and dried under a reduced pressure at 50° C. overnight. The obtained polymer (A-1) had the Mw of 15,000 and the Mw/Mn of 2.6.

Synthesis Example 2

After 100 g of a compound represented by the above formula (M-2) that provides the structural unit (I) and 6 g of AIBN were dissolved into 300 g of methyl ethyl ketone, the mixture was subjected to polymerization for 6 hrs under a nitrogen atmosphere while the reaction temperature was maintained at 78° C. After the polymerization, methyl ethyl ketone was distilled in vacuo, and the obtained polymer was dissolved into 100 g of methyl ethyl ketone, followed by addition of the obtained polymer dropwise to 2,000 g of n-hexane to allow the polymer to be solidified. Next, the polymer was washed with 300 g of n-hexane twice, and the generated white powder was filtered and dried under a reduced pressure at 50° C. overnight. The obtained polymer (A-2) had the Mw of 8,000 and the Mw/Mn of 2.3.

Synthesis Example 3

After 30 g of a compound represented by the above formula (M-1) and 70 g of a compound represented by the formula (M-2) that provide the structural unit (I), 2.4 g of AIBN, and 0.4 g of t-dodecyl mercaptan were dissolved into 200 g of propylene glycol monomethyl ether, the mixture was subjected to polymerization for 6 hrs under a nitrogen atmosphere while the reaction temperature was maintained at 70° C. After the polymerization, propylene glycol monomethyl ether was distilled in vacuo, and the obtained polymer was dissolved into 100 g of propylene glycol monomethyl ether, followed by addition of the obtained polymer dropwise to 2,000 g of n-hexane to permit solidification purification of the polymer. Next, to the polymer was added 150 g of propylene glycol monomethyl ether again, and then 150 g of methanol, 12 g of triethylamine and 2 g of water were further added. The mixture was subjected to a hydrolysis reaction for 8 hrs while refluxing at a boiling point.

After it was ascertained by infrared spectrometry that deacetylation quantitatively proceeded and poly(p-hydroxystyrene) was obtained, the solvent and the triethylamine were distilled in vacuo. The obtained polymer was dissolved in 150 g of acetone, which was thereafter added dropwise to 2,000 g of water to permit solidification, and the generated white powder was filtered and dried under a reduced pressure at 50° C. overnight. The obtained polymer (A-3) had the Mw of 17,000 and the Mw/Mn of 2.1.

Synthesis Example 4

After 70 g of a compound represented by the above formula (M-2) and 30 g of a compound represented by the formula (M-9) that provide the structural unit (I), and 2.4 g of AIBN were dissolved into 200 g of methyl ethyl ketone, the mixture was subjected to polymerization for 6 hrs under a nitrogen atmosphere while the reaction temperature was maintained at 78° C. After the polymerization, methyl ethyl ketone was distilled in vacuo, and the obtained polymer was dissolved into 100 g of methyl ethyl ketone, followed by addition of the obtained polymer dropwise to 2,000 g of n-hexane to permit solidification purification of the polymer. Next, the polymer was washed with 300 g of n-hexane twice, and the generated white powder was filtered dried under a reduced pressure at 50° C. overnight. The obtained polymer (A-4) had the Mw of 9,000 and the Mw/Mn of 2.2.

Synthesis Example 5

After 70 g of a compound represented by the above formula (M-2) and 30 g of a compound represented by the formula (M-10) that provide the structural unit (I), and 2.4 g of AIBN were dissolved into 200 g of methyl ethyl ketone, the mixture was subjected to polymerization for 6 hrs under a nitrogen atmosphere while the reaction temperature was maintained at 78° C. After the polymerization, methyl ethyl ketone was distilled in vacuo, and the obtained polymer was dissolved into 100 g of methyl ethyl ketone, followed by addition of the obtained polymer dropwise to 2,000 g of n-hexane to permit solidification purification of the polymer. Next, the polymer was washed with 300 g of n-hexane twice, and the generated white powder was filtered dried under a reduced pressure at 50° C. overnight. The obtained polymer (A-5) had the Mw of 9,000 and the Mw/Mn of 2.2.

<Preparation of Protective Film-Forming Composition>

Each component other than the polymer (A) used for preparing the composition for forming a protective film is shown below.

((B) Organic Solvent)
B-1: 4-methyl-2-pentanol
B-2: diisoamyl ether

Example 1

One hundred parts by mass of the polymer (A-1) prepared in Synthesis Example 1, and 9,000 parts by mass of the solvent (B-1) and 1,000 parts by mass of the solvent (B-2) were mixed, and the obtained mixed liquid was filtered using a membrane filter having a pore size of 0.20 µm, whereby (T-1) a composition for forming a protective film was prepared.

Examples 2 to 5

Compositions for forming protective films (T-2) to (T-5), respectively, were prepared by a similar operation to Example 1 except that each component having a type and an amount shown in Table 1 was used.

TABLE 1

| Composition for forming protective film | (A) Polymer type | parts by mass | (B) Solvent type | parts by mass |
|---|---|---|---|---|
| Example 1 | T-1 | A-1 | 100 | B-1/B-2 | 9,000/1,000 |
| Example 2 | T-2 | A-2 | 100 | B-2 | 10,000 |
| Example 3 | T-3 | A-3 | 100 | B-1/B-2 | 3,000/7,000 |

TABLE 1-continued

| Composition for forming protective film | (A) Polymer type | parts by mass | (B) Solvent type | parts by mass |
|---|---|---|---|---|
| Example 4 | T-4 | A-4 | 100 | B-1/B-2 | 3,000/7,000 |
| Example 5 | T-5 | A-5 | 100 | B-1/B-2 | 3,000/7,000 |

<Synthesis of (C) Polymer for a Photoresist Composition>

Synthesis Example 6

After 55 g of a compound represented by the above formula (M-3), 45 g of a compound represented by the formula (M-4), and 3 g of AIBN were dissolved into 300 g of methyl ethyl ketone, the mixture was subjected to polymerization for 6 hrs under a nitrogen atmosphere while the reaction temperature was maintained at 78° C. After the polymerization, the reaction solution was added dropwise to 2,000 g of methanol to solidification a copolymer. Next, the copolymer was washed with 300 g of methanol twice, and the generated white powder was filtered and dried under a reduced pressure at 50° C. overnight. The obtained copolymer (C-1) had the Mw of 7,000 and the Mw/Mn of 2.1. As a result of a $^{13}$C-NMR analysis, the proportions of respective structural units derived from the compound (M-3) the compound (M-4) were 52% by mole and 48% by mole, respectively.

Synthesis Example 7

After 50 g of the compound represented by the above formula (M-1), 45 g of the compound represented by the formula (M-4), 3 g of AIBN, and 1 g of t-dodecyl mercaptan were dissolved into 150 g of propylene glycol monomethyl ether, the mixture was subjected to polymerization for 16 hrs under a nitrogen atmosphere while the reaction temperature was maintained at 70° C. After the polymerization, the reaction solution was added dropwise to 1,000 g of n-hexane to permit solidification purification of a copolymer. Next, to the copolymer was added 150 g of propylene glycol monomethyl ether again, and then 150 g of methanol, 37 g of triethylamine and 7 g of water were further added. The mixture was subjected to a hydrolysis reaction for 8 hrs while refluxing at a boiling point to carry out deacetylation of the structural unit derived from the compound represented by the formula (M-1). After the reaction, the solvent and the triethylamine were distilled in vacuo, the obtained copolymer was dissolved in 150 g of acetone, which was then added dropwise to 2,000 g water to permit solidification, and the generated white powder was filtered and was dried under a reduced pressure at 50° C. overnight. The obtained copolymer (C-2) had the Mw of 6,000 and the Mw/Mn of 1.9. As a result of $^{13}$C-NMR analysis, the proportions of respective structural units derived from p-hydroxystyrene and the compound (M-4) were 50% by mole and 50% by mole.

Synthesis Examples 8 to 13

Copolymers (C-3) to (C-8) were obtained by a similar operation to Synthesis Example 7 except that compounds having types and amounts shown in Table 2 were used. The proportion of the structural unit derived from each compounds in the obtained polymer, and the Mw and the Mw/Mn are shown together in Table 2.

TABLE 2

| (C) Polymer | Compound that provides structural unit including an acid-dissociable group | | | Compound that provides other structural unit | | | Mw | Mw/Mn |
|---|---|---|---|---|---|---|---|---|
| | type | amount blended (G) | proportion contained (% By Mole) | type | amount blended (G) | proportion contained (% By Mole) | | |
| Synthesis Example 6 | C-1 | M-4 | 45 | 48 | M-3 | 55 | 52 | 7,000 | 2.1 |
| Synthesis Example 7 | C-2 | M-4 | 45 | 50 | M-1 | 55 | 50 | 6,000 | 1.9 |
| Synthesis Example 8 | C-3 | M-6 | 69 | 50 | M-1 | 41 | 50 | 12,000 | 1.8 |
| Synthesis Example 9 | C-4 | M-7 | 55 | 42 | M-1 | 41 | 50 | 11,000 | 1.8 |
| | | | | | M-5 | 27 | 8 | | |
| Synthesis Example 10 | C-5 | M-6 | 44 | 32 | M-1 | 49 | 60 | 12,000 | 1.2 |
| | | | | | M-5 | 27 | 8 | | |
| Synthesis Example 11 | C-6 | M-6 | 48 | 35 | M-1 | 32 | 40 | 9,600 | 1.7 |
| | | | | | M-8 | 16 | 13 | | |
| | | | | | M-5 | 41 | 12 | | |
| Synthesis Example 12 | C-7 | M-4 | 36 | 40 | M-1 | 16 | 20 | 7,300 | 1.9 |
| | | | | | M-9 | 34 | 30 | | |
| | | | | | M-11 | 28 | 10 | | |
| Synthesis Example 13 | C-8 | M-6 | 38 | 28 | M-1 | 41 | 50 | 7,200 | 1.7 |
| | | | | | M-8 | 15 | 12 | | |
| | | | | | M-10 | 12 | 10 | | |

<Preparation of Photoresist Composition>

Acid generators, acid diffusion control agents and solvents used for preparation of the photoresist composition are shown below.

(Acid Generating Agent)

Compounds represented by the following formulae:

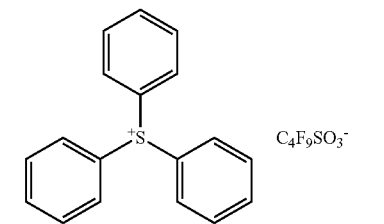
(P-1)

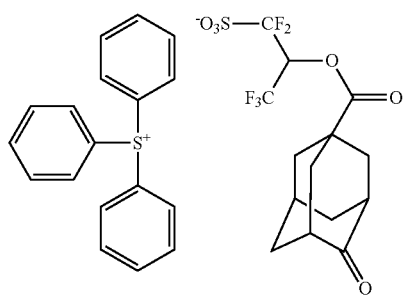
(P-2)

(Acid Diffusion Control Agent)

Compounds represented by the following formulae (Q-1) and (Q-2):

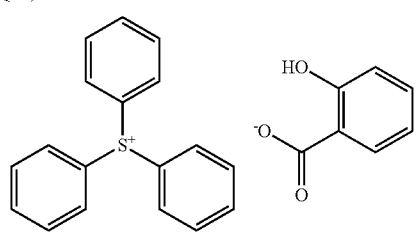
(Q-1)

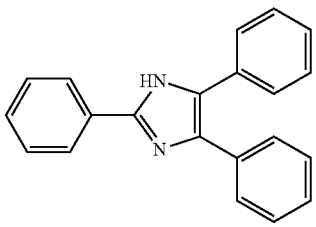
(Q-2)

(Solvent)

PGMEA: propylene glycol monomethyl ether acetate

EL: ethyl lactate

Preparation Example 1

The polymer (C-1) synthesized in Synthesis Example 6 in an amount of 100 parts by mass, 27 parts by mass of the acid generating agent (P-1), 2.6 parts by mass of the acid diffusion control agent (Q-1), 4,300 parts by mass of propylene glycol monomethyl ether acetate (PGMEA) as a solvent and 1,900 parts by mass of ethyl lactate (EL) were mixed, and the obtained mixed liquid was filtered through a membrane filter having a pore size of 0.20 μm to prepare (R-1) a photoresist composition.

Preparation Examples 2 to 8

Photoresist compositions (R-2) to (R-8) were prepared by a similar operation to Preparation Example 1 except that each component having types and amounts shown in Table 3 was used.

TABLE 3

| Photoresist composition | (C) Polymer type | (C) Polymer amount blended (parts by mass) | Acid generating agent type | Acid generating agent amount blended (parts by mass) | Acid diffusion control agent type | Acid diffusion control agent amount blended (parts by mass) | Solvent type | Solvent amount blended (parts by mass) |
|---|---|---|---|---|---|---|---|---|
| Preparation Example 1 | R-1 | C-1 | 100 | P-1 | 27 | Q-1 | 2.6 | PGMEA/EL | 4,300/1,900 |
| Preparation Example 2 | R-2 | C-2 | 100 | P-1 | 27 | Q-1 | 2.6 | PGMEA/EL | 4,300/1,900 |
| Preparation Example 3 | R-3 | C-3 | 100 | P-2 | 23 | Q-1 | 2.2 | PGMEA/EL | 4,300/1,900 |
| Preparation Example 4 | R-4 | C-4 | 100 | P-2 | 23 | Q-1 | 2.2 | PGMEA/EL | 4,300/1,900 |
| Preparation Example 5 | R-5 | C-5 | 100 | P-2 | 23 | Q-1 | 2.2 | PGMEA/EL | 4,300/1,900 |
| Preparation Example 6 | R-6 | C-6 | 100 | P-2 | 23 | Q-2 | 2.0 | PGMEA/EL | 4,300/1,900 |
| Preparation Example 7 | R-7 | C-7 | 100 | P-2 | 23 | Q-2 | 2.0 | PGMEA/EL | 4,300/1,900 |
| Preparation Example 8 | R-8 | C-8 | 100 | P-2 | 23 | Q-2 | 2.0 | PGMEA/EL | 4,300/1,900 |

<Evaluation>
<Measurement of Extinction Coefficient>

Using CLEAN TRACK ACT-8 manufactured by Tokyo Electron Limited, each composition for forming a protective film was spin-coated on a silicon wafer, and baked at 110° C. for 60 sec to give a protective film having a film thickness of 30 nm. Thereafter, using a spectroscopic ellipsometer VUV-VASE (manufactured by J. A. Woollam Co.), an optical constants (extinction coefficient) in the range of a wavelength of 150 nm to 1,000 nm was calculated. The results are shown in FIG. 1.

As shown in FIG. 1, it was revealed that the protective film formed from the composition for forming a protective film of the embodiment of the present invention exhibited absorption at a wavelength of 150 nm to 350 nm. Therefore, when the protective film formed from the composition for forming a protective film of the embodiment of the present invention is laminated on a resist, cutoff of OOB radiation generated simultaneously upon exposure using EUV light is enabled.

<Formation of Resist Pattern>

Example 6

The photoresist composition (R-1) prepared in Preparation Example 1 was spin-coated on a silicon wafer in CLEAN TRACK ACT-8 manufactured by Tokyo Electron Limited, followed by PB carried out under a condition at 110° C. for 60 sec to form a resist film having a film thickness of 50 nm. Thereafter, the composition for forming a protective film (T-1) was spin-coated on the silicon wafer on which the resist film had been formed, followed by PB carried out under a condition at 110° C. for 60 sec to form a resist film having a film thickness of 30 nm. Thereafter, a entire surface exposure was carried out on the silicon wafer at an exposure dose of 5 mJ/cm² without interposing a mask pattern under optical conditions including NA: 0.78, Sigma: 0.85 and ⅔ Annular using an ArF projection aligner S306C manufactured by Nikon Corporation. Subsequently, patterning was carried out by irradiating with an electron beam was irradiated using a simplified electron beam drawing apparatus (manufactured by Hitachi, Ltd., model HL800D; output: 50 KeV, electric current density: 5.0 ampere/cm²). After the irradiation with an electron beam, PEB was carried out in the CLEAN TRACK ACT-8 under a condition at 100° C. for 60 sec. Thereafter, development was carried out at 23° C. for 1 min by a puddling method in the CLEAN TRACK ACT-8 using a 2.38% by mass aqueous tetramethylammonium hydroxide solution, followed by washing with pure water, drying to form a resist pattern.

Examples 7 to 18 and Comparative Examples 1 and 2

Each resist pattern was formed by a similar operation to Example 6 except that the compositions for forming a protective film and photoresist compositions described in Table 4 were used. With regard to the resist patterns formed in this manner, evaluations of sensitivity, nanoedge roughness and resolution shown below were each made. The results of the evaluations are shown in Table 4. It is to be noted that "–" in Table 4 denotes that no composition for forming a protective film was used.

[Sensitivity (C/cm²)]

An exposure dose at which a line and space pattern (1L 1S) configured with a line part having a line width of 150 nm and a space part formed by neighboring line parts with an interval of 150 nm was formed to give a line width of 1:1 was defined as "optimal exposure dose", and the "optimal exposure dose" was defined as "sensitivity" (μC/cm²). When the sensitivity was no greater than 50 (μC/cm²), the sensitivity was judged as "favorable".

[Nanoedge Roughness (nm)]

Figure 2:
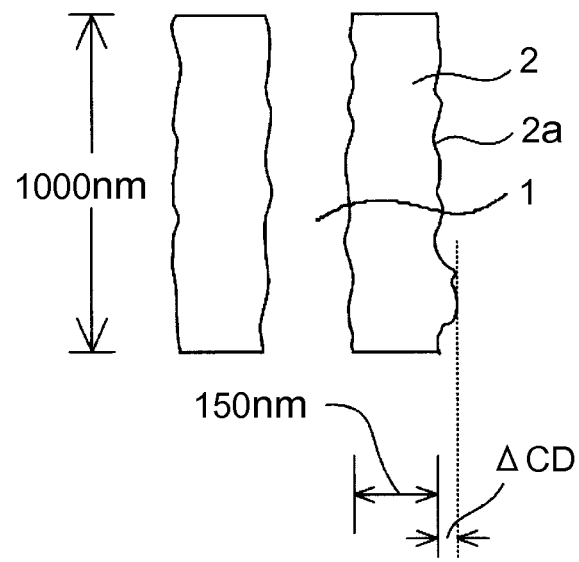
FIG. 2 shows a schematic plan view illustrating a line pattern seen from above.
Figure 3:
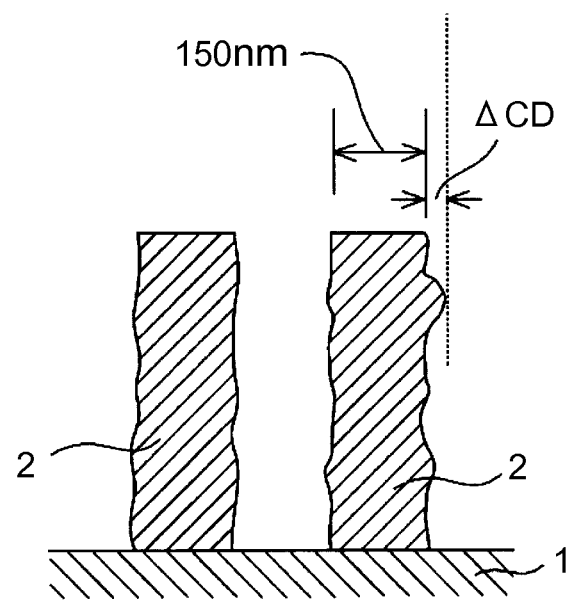
FIG. 3 shows a schematic cross sectional view illustrating a line pattern configuration.

The line patterns of the line and space pattern (1L 1S) were observed using a high-resolution FEB measurement device (S-9220, manufactured by Hitachi, Ltd.) at arbitrary twenty points on the substrate. With respect to the observed shapes, as shown in FIG. 2 and FIG. 3, a difference "ΔCD" between a designed line width of 150 nm and a line width in an area in which irregularities generated along side lateral surface 2a of the line part 2 in a resist coating formed on silicon wafer 1 was most significant was measured, and the average value of the ΔCD was defined as "nanoedge roughness" (nm). The nanoedge roughness (nm) of no greater than 15 (nm) was judged as "AA (very favorable)"; the nanoedge roughness (nm) of greater than 15.0 (nm) and no greater than 16.5 (nm) was judged as "A (favorable)"; and the nanoedge roughness (nm) of greater than 16.5 (nm) was judged as "B (poor)". It is to be noted that irregularities shown in FIG. 2 and FIG. 3 are described more exaggeratingly than the actual shapes.

[Resolution (nm)]

With respect to the line and space pattern (1L 1S) described above, the minimum line width (nm) in the line pattern resolved at the optimal exposure dose was defined as "resolution" (nm). When the resolution was no greater than 100 (nm), the resolution was judged as "favorable".

TABLE 4

| | Composition for forming protective film | Photo-resist composition | Evaluation result | | |
|---|---|---|---|---|---|
| | | | Sensitivity ($\mu C/cm^2$) | Nanoedge roughness (nm) | Resolution (nm) |
| Example 6 | T-1 | R-1 | 42.0 | 16.1 | 60 |
| Example 7 | T-2 | R-1 | 43.0 | 15.4 | 60 |
| Example 8 | T-1 | R-2 | 40.0 | 14.9 | 60 |
| Example 9 | T-2 | R-2 | 42.5 | 14.5 | 50 |
| Example 10 | T-3 | R-2 | 41.0 | 14.6 | 60 |
| Example 11 | T-4 | R-2 | 40.5 | 14.3 | 50 |
| Example 12 | T-5 | R-2 | 41.0 | 14.7 | 50 |
| Example 13 | T-2 | R-3 | 47.0 | 13.0 | 60 |
| Example 14 | T-2 | R-4 | 50.0 | 12.5 | 60 |
| Example 15 | T-2 | R-5 | 49.0 | 12.6 | 60 |
| Example 16 | T-2 | R-6 | 48.0 | 12.9 | 60 |
| Example 17 | T-2 | R-7 | 47.0 | 11.9 | 60 |
| Example 18 | T-2 | R-8 | 47.0 | 13.0 | 60 |
| Comparative Example 1 | — | R-1 | 32.0 | 17.0 | 110 |
| Comparative Example 2 | — | R-2 | 29.0 | 16.9 | 110 |

[Outgassing (OG)]

In CLEAN TRACK ACT-8 manufactured by Tokyo Electron Limited, the photoresist composition (R-1) prepared in Preparation Example 1 was spin-coated on a silicon wafer, followed by PB carried out under a condition at 110° C. for 60 sec to form a resist film having a film thickness of 50 nm. Thereafter, each composition for forming a protective film according to Examples 1 to 5 was spin-coated on the silicon wafer on which the resist film had been formed, followed by PB carried out under a condition at 110° C. for 60 sec to form a protective film having a film thickness of 30 nm. An entire surface exposure was carried out on the silicon wafer at an exposure dose of 15 mJ/cm² of without interposing a mask pattern under optical conditions including NA: 0.68, Sigma: 0.75 and Conventional, using an ArF projection aligner S306C manufactured by Nikon Corporation. It is to be noted that no protective film was formed in Comparative Examples.

An outgassing analysis was performed according to determination using a commercially available thermal desorption gas chromatography-mass spectrometer (SWA-256, manufactured by GL Sciences, Inc.). Organic matter was desorbed from the surface of the wafer under a condition at 25° C. for 60 min, and the outgassed component desorbed was once collected in a trapping column. Thereafter, the trapping column was heated at 200° C., whereby the organic matter was desorbed again from the trapping column, and then the outgassed component desorbed was cooled to allow for contraction in volume using liquid nitrogen by a thermal desorption cold trap injector. Thereafter, the collected gas component was introduced into a gas chromatography (manufactured by JNS-GCMATE GCMS SYSTEM, manufactured by JEOL) at once by rapidly heated to 230° C., and subjected to determination.

The outgassing analysis was performed on compounds (G-1), (G-2) and (G-3) represented by the following formulae, and quantitative determination was carried out using a calibration curve made beforehand with commercially available products of each compound. The results are shown in Table 5. Values of the amount of outgassing in Examples 1 to 5 shown in Table 5 are relative values when the amount of outgassing in Comparative Example 3 was defined as 100. When the amount of outgassing was no greater than 80, an inhibitory effect of outgassing by the composition for forming a protective film was judged as "favorable".

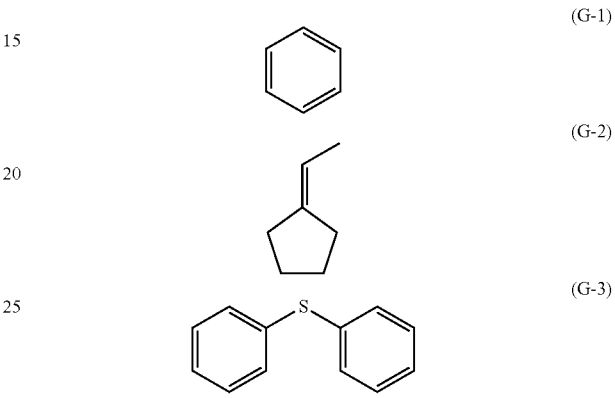

TABLE 5

| | Composition for forming a protective film | Photoresist composition | Amount of outgassing | | |
|---|---|---|---|---|---|
| | | | G-1 | G-2 | G-3 |
| Example 1 | T-1 | R-1 | 50 | 40 | 15 |
| Example 2 | T-2 | R-1 | 45 | 40 | 15 |
| Example 3 | T-3 | R-1 | 55 | 50 | 15 |
| Example 4 | T-4 | R-1 | 60 | 60 | 20 |
| Example 5 | T-5 | R-1 | 60 | 50 | 30 |
| Comparative Example 3 | — | R-1 | 100 | 100 | 100 |

As shown in Table 4 and Table 5, in Examples in which the protective film according to the embodiment of the present invention was used, the nanoedge roughness was significantly ameliorated and also the resolution was favorable as compared to Comparative Examples in which no protective film was used. In addition, it was ascertained that not only sufficiently satisfactory sensitivity but also an effect to inhibit occurrence of outgassing was revealed according to the embodiment of the present invention.

According to the embodiment of the present invention, can be provided a novel method for forming a resist pattern in which by reducing influences from OOB radiation generated upon exposure in lithography techniques using EUV light or an electron beam, nanoedge roughness can be ameliorated and also a sufficiently satisfactory resolving ability and sensitivity can be attained, whereas occurrence of outgassing can be inhibited, and a composition for forming a protective film suitably used for the method for forming a resist pattern is further provided. Therefore, the method for forming a resist pattern, and the composition for forming a protective film can be suitably used for forming a resist pattern in a lithography step of various types of electronic devices such as semiconductor devices and liquid crystal devices.

Obviously, numerous modifications and variations of the present invention are possible in light of the above teachings. It is therefore to be understood that within the scope of the appended claims, the invention may be practiced otherwise than as specifically described herein.

What is claimed is:

1. A method for forming a resist pattern, comprising:
providing a resist film;
providing a protective film on the resist film using a composition for forming the protective film, the composition comprising a polymer and an organic solvent;
exposing to irradiation with EUV light or an electron beam the resist film on which the protective film is provided; and
developing the exposed resist film,
wherein the polymer has a structural unit represented by formula (1) in an amount of no less than 50 mol % in the polymer:

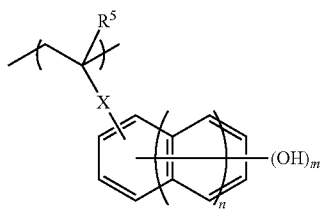

(1)

wherein, in the formula (1), $R^5$ represents a hydrogen atom, a methyl group or a trifluoromethyl group; X represents a single bond, —(CO)O— or —(CO)NH—; n is an integer of to 3, and m is an integer that satisfies an expression: 1≤m≤5+2n, and
wherein the organic solvent comprises an ether solvent and a content of the ether solvent is no less than 20% by mass.

2. The method according to claim 1, wherein the organic solvent further comprises an alcohol solvent.

3. The method according to claim 1, wherein a greatest value of an extinction coefficient of the protective film in a range of a wavelength of no less than 150 nm and no greater than 350 nm is no less than 0.3.

4. The method according to claim 1, wherein the polymer further comprises a structural unit represented by formula (4):

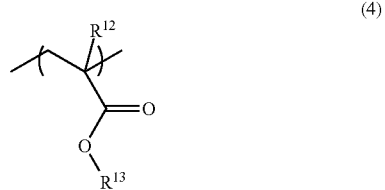

(4)

wherein, in the formula (4), $R^{12}$ represents a hydrogen atom, a methyl group, a fluorine atom or a trifluoromethyl group; and $R^{13}$ represents a linear or branched fluorinated hydrocarbon group having 1 to 10 carbon atoms or a fluorinated alicyclic hydrocarbon group having 3 to 10 carbon atoms.

5. The method according to claim 1, wherein the polymer has the structural unit represented by formula (1) in an amount of no less than 70 mol % in the polymer.

6. The method according to claim 1, wherein the polymer has the structural unit represented by formula (1) in an amount of no less than 90 mol % in the polymer.

7. A method for forming a resist pattern, comprising:
providing a resist film;
providing a protective film on the resist film using a composition for forming the protective film, the composition comprising polyhydroxystyrene and an organic solvent;
exposing to irradiation with EUV light or an electron beam the resist film on which the protective film is provided; and
developing the exposed resist film.

8. The method according to claim 7, wherein the organic solvent comprises an ether solvent, an alcohol solvent, or a mixture thereof.

9. The method according to claim 8, wherein the organic solvent comprises the ether solvent and a content of the ether solvent is no less than 20% by mass.

10. The method according to claim 7, wherein a greatest value of an extinction coefficient of the protective film in a range of a wavelength of no less than 150 nm and no greater than 350 nm is no less than 0.3.

* * * * *

UNITED STATES PATENT AND TRADEMARK OFFICE
CERTIFICATE OF CORRECTION

PATENT NO.        : 9,052,600 B2                           Page 1 of 1
APPLICATION NO.   : 13/604810
DATED             : June 9, 2015
INVENTOR(S)       : Ken Maruyama et al.

It is certified that error appears in the above-identified patent and that said Letters Patent is hereby corrected as shown below:

Claims

Column 51, Line 33, Claim 1 "n is an integer of to 3" should read -- n is an integer of 0 to 3 --.

Signed and Sealed this
Tenth Day of November, 2015

Michelle K. Lee
*Director of the United States Patent and Trademark Office*